US007822591B2

(12) United States Patent
Otsuki et al.

(10) Patent No.: US 7,822,591 B2
(45) Date of Patent: Oct. 26, 2010

(54) LOGIC CIRCUIT MODEL CONVERSION APPARATUS AND METHOD THEREOF; AND LOGIC CIRCUIT MODEL CONVERSION PROGRAM

(75) Inventors: Tomoshi Otsuki, Yokohama (JP); Nobuhiro Nonogaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1034 days.

(21) Appl. No.: 11/534,390

(22) Filed: Sep. 22, 2006

(65) Prior Publication Data

US 2007/0129925 A1 Jun. 7, 2007

(30) Foreign Application Priority Data

Dec. 1, 2005 (JP) ............................. 2005-348144

(51) Int. Cl.
*G06F 17/50* (2006.01)
(52) U.S. Cl. ........................................... 703/14; 716/1
(58) Field of Classification Search ................... 703/14; 716/1
See application file for complete search history.

(56) References Cited

U.S. PATENT DOCUMENTS

| | | | | |
|---|---|---|---|---|
| 5,577,233 | A * | 11/1996 | Goettelmann et al. | 703/26 |
| 5,862,361 | A | 1/1999 | Jain | |
| 5,995,736 | A * | 11/1999 | Aleksic et al. | 716/18 |
| 6,263,495 | B1 * | 7/2001 | Kataoka | 717/131 |
| 6,295,627 | B1 * | 9/2001 | Gowni et al. | 716/1 |
| 6,438,730 | B1 * | 8/2002 | Atmakuri et al. | 716/1 |
| 7,024,652 | B1 * | 4/2006 | McGaughy et al. | 716/12 |
| 2002/0032894 | A1 * | 3/2002 | Miyazaki et al. | 716/2 |
| 2005/0044438 | A1 | 2/2005 | Nonogaki et al. | |
| 2005/0268268 | A1 * | 12/2005 | Wang et al. | 716/9 |

FOREIGN PATENT DOCUMENTS

JP 2005-62106 3/2005

OTHER PUBLICATIONS

Andy Zaidman, Serge Demeyer, "Managing Trace Data Volume through a Heuristical Clustering Process Based on Event Execution Frequency," Software Maintenance and Reengineering, European Conference on, pp. 329, Eighth Euromicro Working Conference on Software Maintenance and Reengineering (CSMR'04), 2004.*

* cited by examiner

*Primary Examiner*—David Silver
*Assistant Examiner*—Kamini S Shah
(74) *Attorney, Agent, or Firm*—Oblon, Spivak, McClelland, Maier & Neustadt, L.L.P.

(57) ABSTRACT

A logic circuit model conversion apparatus includes a first analysis unit which analyzes a model in which a logic circuit of a register transfer level has been coded and outputs simultaneous blocks and an analysis result, a creating unit which creates a common execution frequency group that is a set of codes whose execution frequency becomes common, based on the simultaneous blocks and analysis result, a second analysis unit which analyzes the common execution frequency group and creates a formula of a general term to derive a predetermined value of each register, a third analysis unit which analyzes a mutual relationship between the common execution frequency groups and derives an execution frequency of each common execution frequency group up to a predetermined time, and a deriving unit which derives a value of each of the registers at the predetermined time from the formula of the general term and execution frequency.

13 Claims, 20 Drawing Sheets

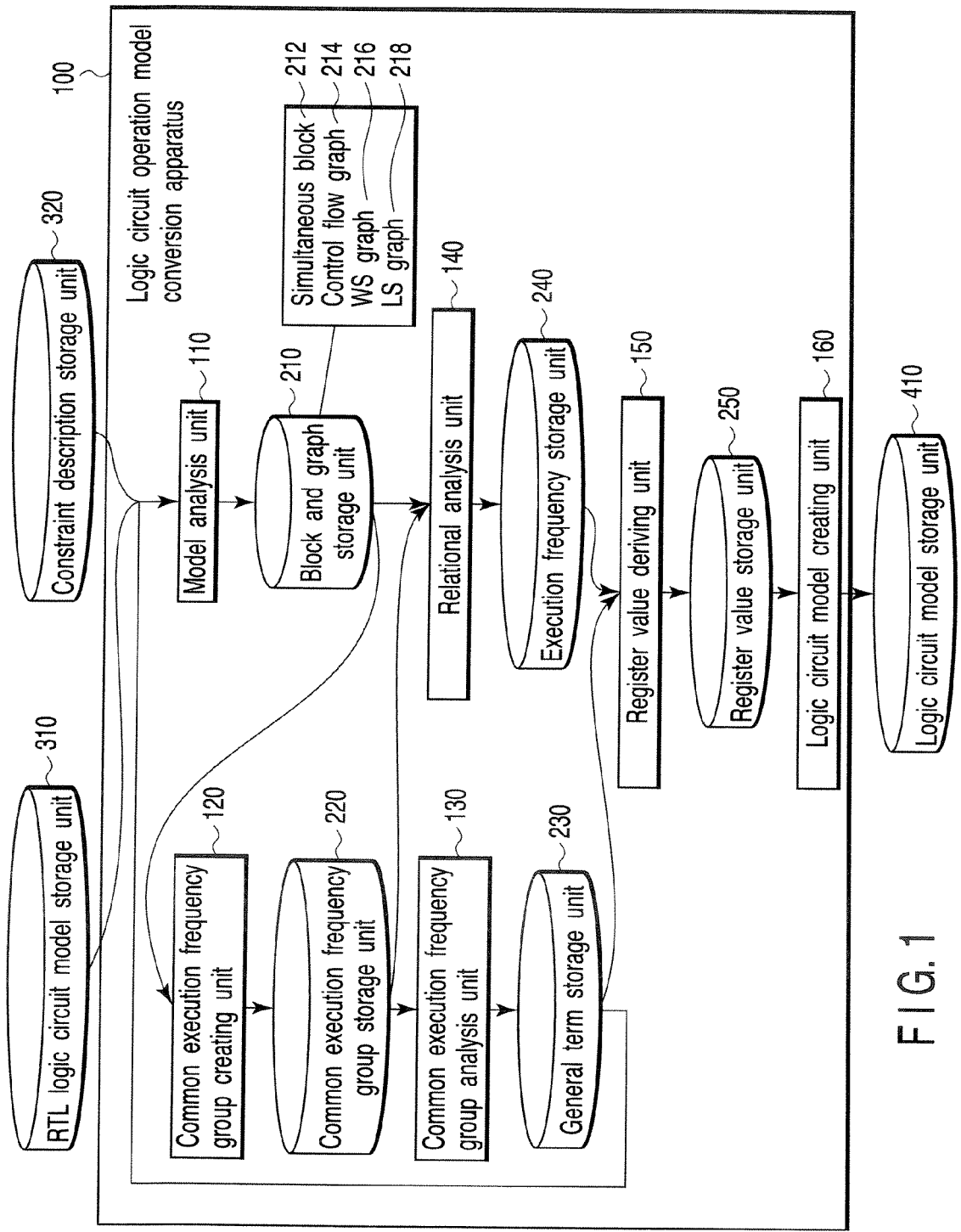
F I G. 1

```
module M3
always @ (posedge CLK)
    if (IO == 1)
        cikle <= IO_cikle;
    else
        cikle <= cikle_next;
    end
end
end
```

```
module M4
always @ (cikle)
    cikle_next <= cikle;
end
end
```

```
module M5 // clk_generator
always begin
    clk <= 1;
    #32
    clk <= 0;
    #32
end
end
```

```
module M1
always @ (posedge CLK or posedge RESET)
    if (RESET == 0)
        cnt <= 0;
    else
        cnt <= cnt_next;
    end
end
end
```

```
module M2
always @ (cnt)
    cnt_next <= cnt+1;
    if (cnt %cikle == 0)
        output <= 1;
    else
        output <= 0;
    end
end
end
```

F I G. 3

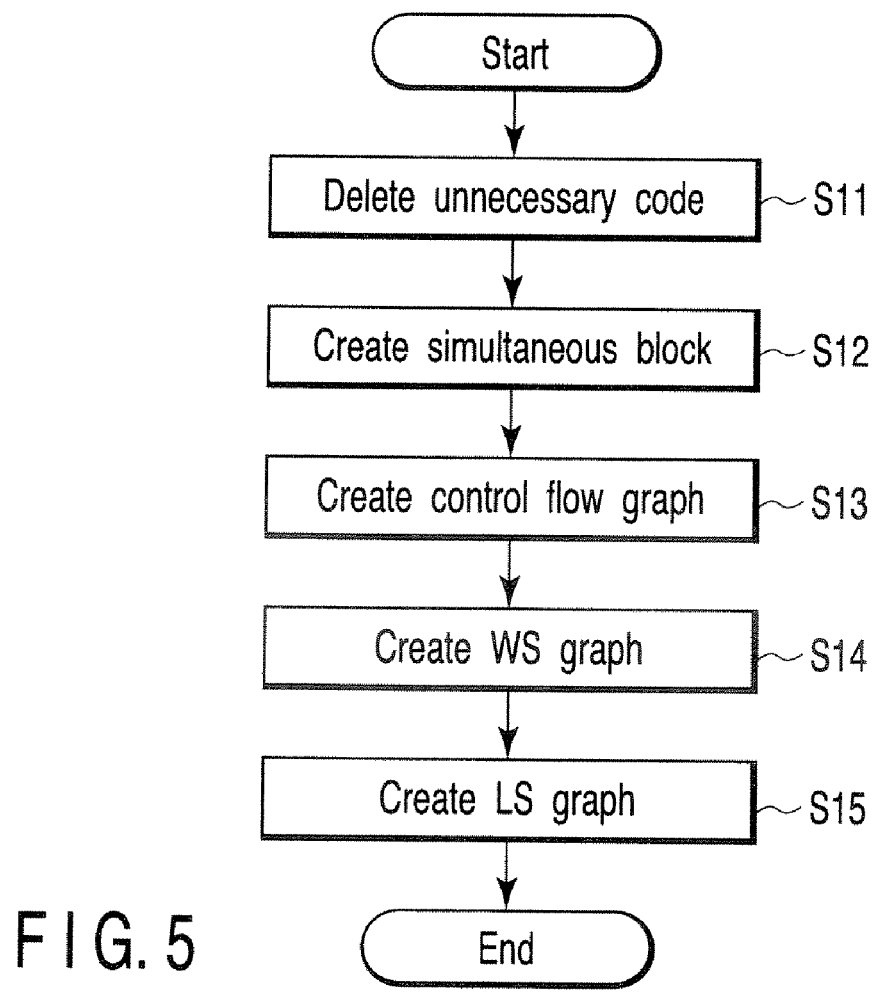

```
module M3
always @ (posedge CLK)
    #10 = #
    cikle <= 10_cikle;
    else
        cikle <= cikle_next;
    end
end
```

```
module M4
always @ (cikle)
    cikle_next <= cikle;
end
end
```

```
module M5 // clk_generator
always begin
    clk <= 1;
    #32
    clk <= 0;
    #32
end
end
```

```
module M1
always @ (posedge CLK or posedge RESET)
    if (RESET == 0)
        cnt <= 0;
    else
        cnt <= cnt_next;
    end
end
```

```
module M2
always @ (cnt)
    cnt_next <= cnt+1;
    if (cnt %cikle == 0)
        output <= 1;
    else
        output <= 0;
    end
end
```

F I G. 6

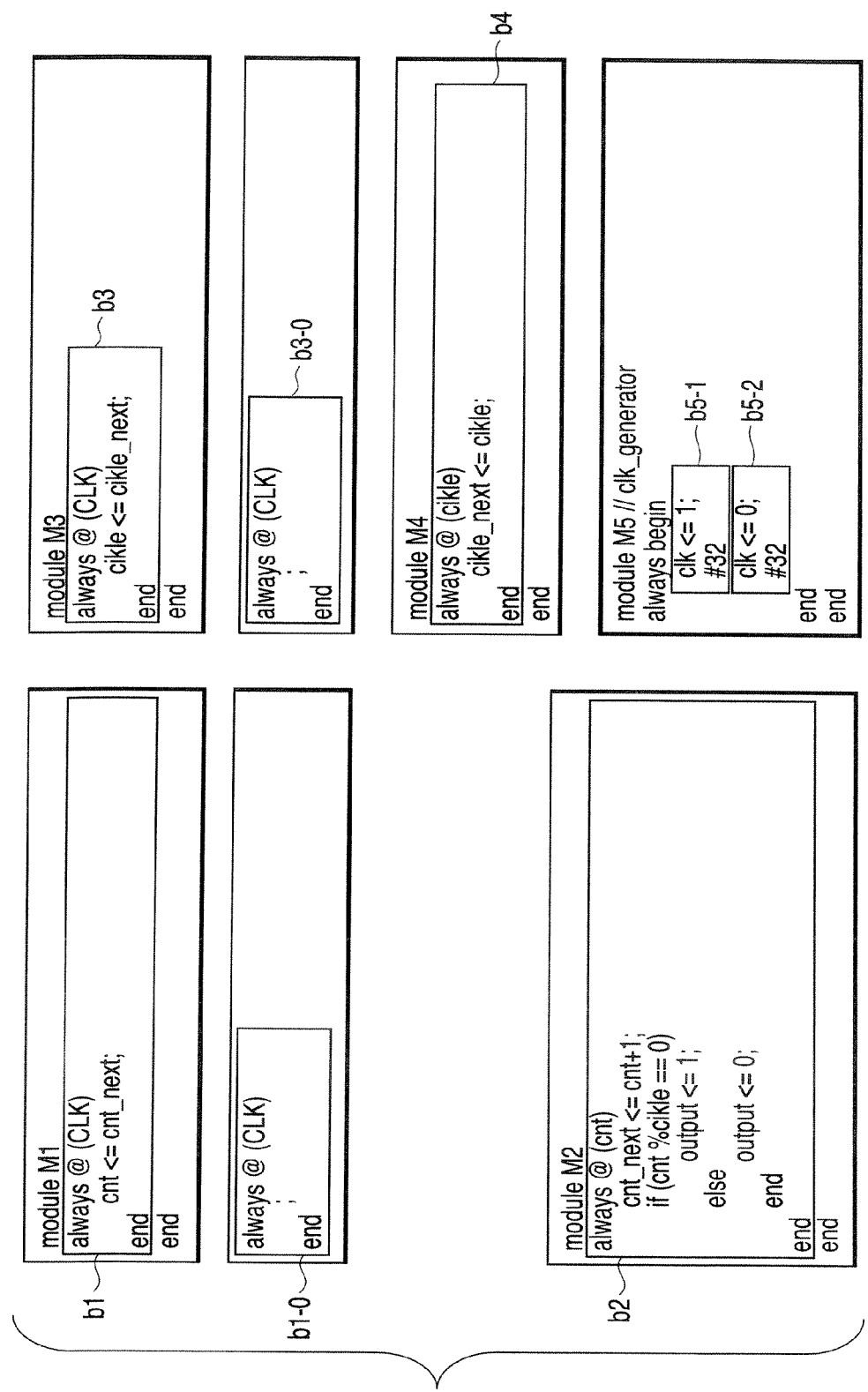
F I G. 8

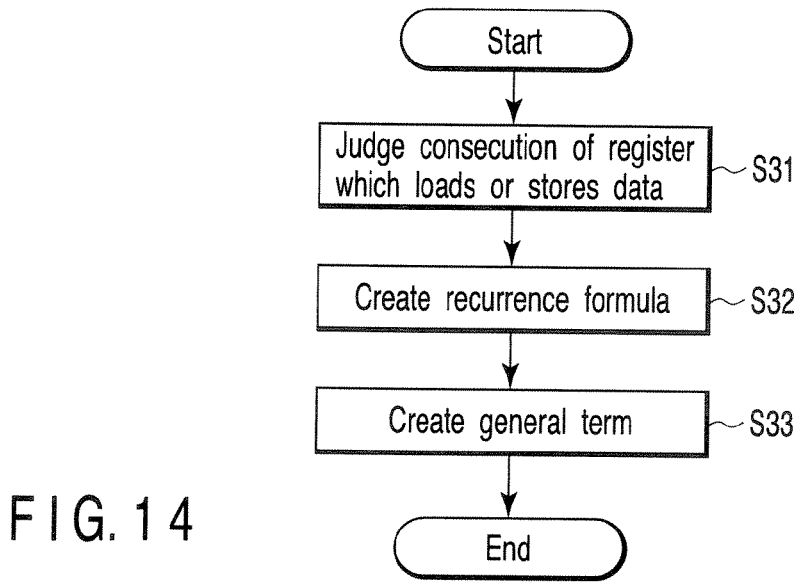
F I G. 1 4
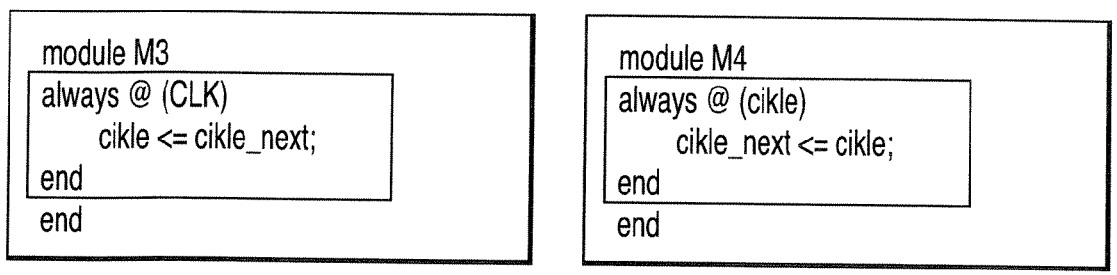
F I G. 1 5 A
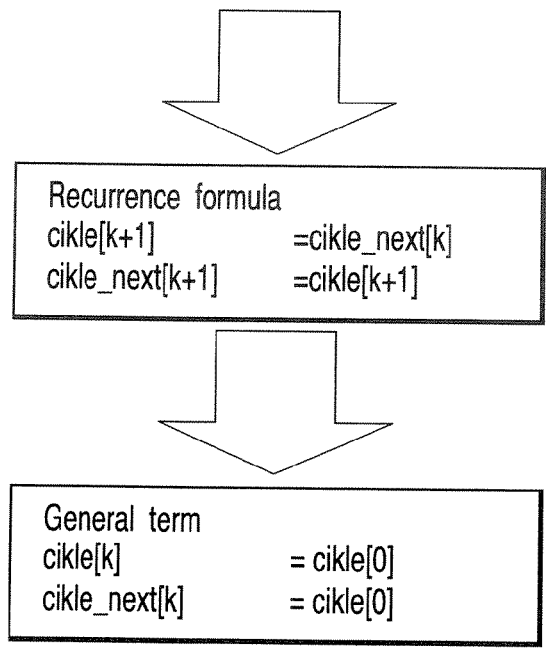
F I G. 1 5 B
F I G. 1 5 C Input :
Simulation time T
Register for storing value of each register at time o
Clk0, cikle0, cikle_next0,
Cnt0, cnt_next0, output0

```
module Mfinal
If ((clk0 + (T/32))%2 == 1)
      clk <= 1
else
      clk <= 0
end
cikle         <= cikle0
cikle_next    <= cikle_next0
cnt <= cnt0 + (T/64)
cnt_next <= cnt0 + (T/64) + 1
If (cnt%cikle == 0)
      output <= 1
else
      output <= 0
end
end
```

F I G. 22

LOGIC CIRCUIT MODEL CONVERSION APPARATUS AND METHOD THEREOF; AND LOGIC CIRCUIT MODEL CONVERSION PROGRAM

CROSS REFERENCE TO RELATED APPLICATIONS

This application is based upon and claims the benefit of priority from prior Japanese Patent Application No. 2005-348144, filed Dec. 1, 2005, the entire contents of which are incorporated herein by reference.

BACKGROUND OF THE INVENTION

1. Field of the Invention

The present invention relates to a logic circuit model conversion apparatus and a method thereof; and a logic circuit model conversion program.

2. Description of the Related Art

The design/manufacture of a large scale logic circuit such as an LSI is often carried out as follows. Hardware is described in a language called Hardware Description Language (hereinafter, referred to as "HDL"). The described HDL is converted into data indicating connection relationship between circuit elements called "net list". Then, hardware such as an actual LSI is manufactured from this net list.

Converting the HDL into a net list is called "logical synthesis", and the HDL can be converted into the net list by using a predetermined logic synthesis tool. The net list is data representing a mutual connectivity with a circuit element such as an AND circuit, an OR circuit, a register, or a counter, for example. By using the net list, a so called circuit diagram that exists conventionally can be printed out.

There are a variety of HDLs, and, for example, the HDLs such as Verilog-HDL, VHDL, and System C are often used today. In addition, in the HDLs, some description levels exist, and typically, there are a Behavior Level and a Register Transfer Level (hereinafter, referred to as "RTL").

The Behavior Level is a level at which an operation (including a software operation in addition to a hardware operation) is represented without "concept of clock". This level is used for description of a circuit block in which detailed design specification is not defined or description of a model provided for the purpose of simulation, for example, description of a modeled CPU operation.

In contrast, the RTL is a level of expressing a register, a counter and the like that are constituent circuit elements and a transfer state (connection state) of data between them. At this level, "concept of clock" for operating these constituent elements exists.

In order to "logically synthesize" an HDL and generate a net list, it is necessary to describe the HDL in the RTL. A logic circuit described in the HDL at the RTL level is referred to as a "logic circuit RTL model".

On the other hand, in a large-scale circuit today, in addition to a design of the circuit itself, verification and evaluation of the designed circuit becomes very important. Sufficient verification and evaluation are carried out at a design stage (before producing a material). As a result, a development period is shortened, and a development cost can be reduced.

Further, in many of the systems today, hardware/software integrated systems including microprocessors or the like becomes common. Thus, there is a growing need for verification and evaluating software operated by microprocessors or the like as well as verification and evaluating hardware.

In the meantime, a logic circuit widely used today is a synchronous logic circuit. In a "logic circuit RTL model", a description is given so as to carry out writing into a defined register group by using a sync signal such as clock and reset. Therefore, time-based accuracy that can be evaluated in the "logic circuit RTL model" is accuracy that can be guaranteed to enable verification as to whether or not a register value is correct every time a sync signal such as a cyclic clock is inputted (hereinafter, referred to as "clock cycle accuracy"). In this manner, the verification using the "logic circuit RTL model" enables very strict verification for every clock cycle.

However, in a large-scale logic circuit including microprocessors or the like, when individual logic circuits or software components communicating with these circuits and operating on microprocessors are verified with clock cycle accuracy by using a simulation environment in which the "logic circuit RTL model" and the simulator of the microprocessors are connected to each other, a simulation time becomes very long.

On the other hand, in the case of software verification such as microprocessors communicating with the "logic circuit RTL model", it is not always necessary to verify with fine accuracy such as clock cycle accuracy. In addition, it is not necessary to fully monitor and verify the states of internal registers in the "logic circuit RTL model".

Therefore, there have been developed a variety of techniques of lowering the time accuracy of simulation (time-based monitoring and verifying roughness) or spatial accuracy (type or quantity of register or signal to be monitored or verified) in a range for achieving a verification purpose, thereby shortening a simulation time.

For example, in the U.S. Pat. No. 5,862,361, there is disclosed a technique of creating a table with respect to times of clock cycles by utilizing features of a synchronous circuit, and then, carrying out event scheduling before carrying out simulation.

As described above, a model for carrying out simulation (hereinafter, this model is referred to as a "logic circuit operation model") is often generated in accordance with a method of newly generating models each having a high degree of abstraction other than the "logic circuit RTL model", and then, sequentially detailing these models to generate the "logic circuit operation model" or in accordance with a method of using the existing "logic circuit RTL model (model having a low degree of abstraction and having fineness) to summarize the model, thereby converting the summarized model into a "logic circuit operation model".

It is necessary to judge whether or not the "logic circuit operation model" is proper from the three points of view: the accuracy of the "logic circuit operation model" (first condition); what it takes to create the "logic circuit operation model" (second condition); and speed of implementing the logic circuit operation model (third condition).

The accuracy of the "logic circuit operation model" (first condition) is to allocate simulation accuracy (time-based accuracy and spatial accuracy) sufficient to achieve a verification purpose.

What it takes to create the "logic circuit operation model" (second condition) is that the "logic circuit operation model" is provided in a state in which the "logic circuit operation model" coincides with the "logic circuit RTL model" by the time verification of a logic circuit or a software program starts.

The speed of implementing the "logic circuit operation model" (third condition) is to include a speed of executing simulation for the purpose of verification within a sufficiently short time with respect to a period from the beginning to a period of starting verification of the logic circuit or software program.

For example, in the above described method of summarizing a model having fine simulation accuracy (low degree of abstraction) (Refer to U.S. Pat. No. 5,862,361), there is a comparatively high possibility of meeting the first and second condition (development inconvenience) because the "logic circuit operation model" is created while automatic summarization is carried out with the designed "logic circuit RTL model" being a start point. However, this method is not sufficiently fast on an aspect of the implementation speed, and does not meet the third condition.

Therefore, in a conventional technique, it is thought difficult to obtain a "logic circuit operation model" that meets the third condition in which, in a development period to an extent such that while the accuracy of meeting the first condition is maintained, the second condition is met, a simulation implementing time is included in a practically endurable range even in a large-scale system.

BRIEF SUMMARY OF THE INVENTION

According to one aspect of the present invention, there is provided A logic circuit model conversion apparatus comprising: a first analysis unit which analyzes a model in which a logic circuit of a register transfer level has been coded and outputs simultaneous blocks and an analysis result executed at an identical time; a creating unit which creates a common execution frequency group that is a set of codes whose execution frequency becomes common, based on the simultaneous blocks and the analysis result; a second analysis unit which analyzes the common execution frequency group and creates a formula of a general term to derive a predetermined value of each register; a third analysis unit which analyzes a mutual relationship between the common execution frequency groups and derives an execution frequency of each common execution frequency group up to a predetermined time; and a deriving unit which derives a value of each of the registers at the predetermined time from the formula of the general term and the execution frequency. The present invention is established as a method or program invention for achieving functions of the above described apparatus.

BRIEF DESCRIPTION OF THE SEVERAL VIEWS OF THE DRAWINGS

FIG. 1 is a schematic block diagram depicting a basic configuration of a logic circuit model conversion apparatus;

FIG. 3 is a view for illustrating an RTL logic model that is an input of the logic circuit model conversion apparatus;

FIG. 4 is a view showing an example of constraint description at the time of a stationary state;

FIG. 5 is a flow chart showing a specific operation of a model analysis unit;

FIG. 6 is a view showing an example of a deleting process of an unnecessary code in the case where the logic circuit model shown in FIG. 3 and the constraint description at the time of a stationary state shown in FIG. 4 have been given;

FIG. 8 is a view showing an example of creating a simultaneous block in the case where the logic circuit model shown in FIG. 3 and the constraint description at the time of a stationary state shown in FIG. 4 have been given;

FIG. 14 is a flow chart showing a specific operation of a common execution frequency group analysis unit 130;

FIGS. 15A to 15C are views each showing an example of creating a recurrence formula and a formula of general terms using the common execution frequency group analysis unit;

FIG. 22 is a view showing an example of an output of a logic circuit model at the time of a stationary state in the case where the model is outputted in the format of module of Verilog-HDL, for example.

DETAILED DESCRIPTION OF THE INVENTION

Figure 2:
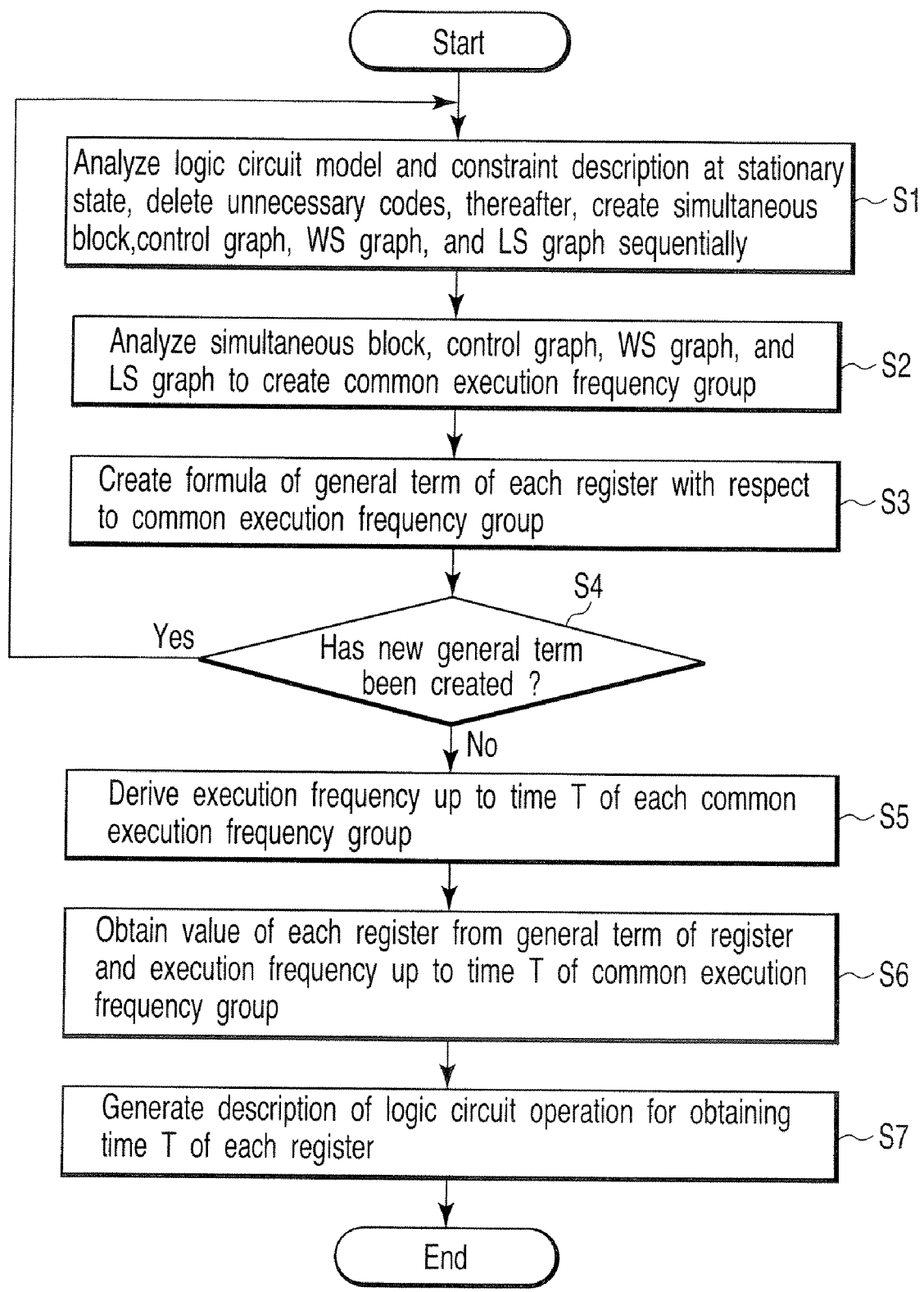
FIG. 2 is a flow chart showing a flow of a basic operation of the logic circuit model conversion apparatus shown in FIG. 1.
Figure 7:
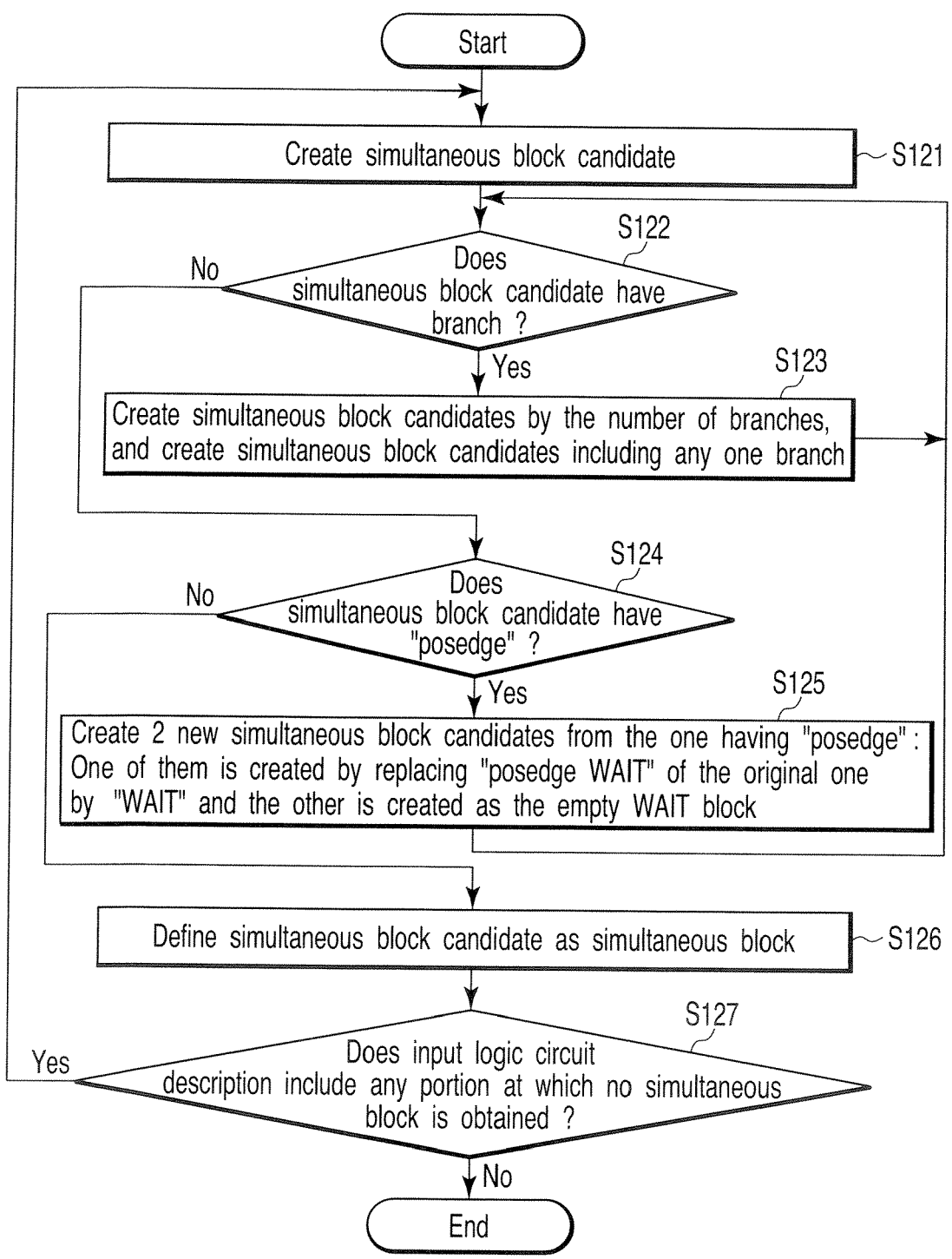
FIG. 7 is a flow chart showing a detailed flow of creating a simultaneous block process.

Embodiments of the present invention will be described with reference to the accompanying drawings.

A hardware behavior often converges into a wasteful behavior such as a periodic behavior after the value of some external inputs has fixed. However, it is difficult to judge this convergence state dynamically at runtime, and thus, a wasteful simulation time is currently consumed. Here, in the hardware RTL model, in a stationary state in which an external input from a bus or the like does not occur, an eliminable serial periodic process can be converted into a single process as long guaranteed that a periodic behavior is actually made with respect to a code that is presumed to be a periodic behavior.

In the embodiment, wasteful serial process is replaced with a single process, thereby speeding up production of an RTL logic circuit model.

In FIG. 1, a logic circuit model conversion apparatus 100 has: a model analysis unit 110; a common execution frequency group creating unit 120; a common execution frequency group analysis unit 130; a relational analysis unit 140; a register value deriving unit 150; and a logic circuit model creating unit 160. In addition, the logic circuit model conversion apparatus 100 has storage units for temporarily storing the data created by each of the units described above. Specifically, the logic circuit model conversion apparatus 100 has: a block and graph storage unit 210 which stores a simultaneous block 212 or the like; a common execution frequency group storage unit 220 which stores a common execution frequency group; a general term storage unit 230 which stores the general term of each register; an execution frequency storage unit 240 which stores the execution frequency up to time T of each common execution frequency group; and a register value storage unit 250 which stores a value of time T of each register. The block and graph storage unit 210 specifically temporarily stores: the simultaneous block 212; a control flow graph 214; a WS graph 216; and an LS graph 218.

The logic circuit model conversion apparatus 100 inputs an RTL logic circuit model and a constraint description at the time of a stationary state, respectively, from an RTL (Register Transfer Level) logic circuit model storage unit 310 and a constraint description storage unit 320, and outputs a logic circuit model at the time of a stationary state to a logic circuit model storage unit 410.

An RTL logic circuit model stored in the RTL logic circuit model storage unit 310 is a hardware model described in Verilog-HDL or the like, as shown in FIG. 3, for example, described later in detail. However, the accuracy equal to or greater than RTL that can be logically synthesized is presumed as an input of the logic circuit model conversion apparatus.

In addition, the constraint description at the time of a stationary state stored in the constraint description storage unit 320 is obtained by describing a limited state targeted for analysis, as shown in FIG. 4, for example, described later in detail, from the viewpoints of a register value, an invariable value property and the like. It is preferable that the logic circuit model conversion apparatus 100 includes the constraint description storage unit 320 because it is a primary object to make efficient a logic circuit model in a stationary state such as a case in which a partial external input does not occur.

Referring to FIG. 2, a description will be given with respect to a flow of a basic operation of the logic circuit model conversion apparatus configured as described above.

The model analysis unit 110 deletes an unnecessary code by analyzing the RTL logic circuit model and the constraint description at the time of a stationary state, which are stored in the RTL logic circuit model storage unit 310 and the constraint description storage unit 320, respectively. Then, the model analysis unit 110 creates: the simultaneous block 212; the control flow graph 214; the WS graph 217; and the LS graph 218 (step S1). The simultaneous block 212, the control flow graph 214, the WS graph 216, and the LS graph 218 are stored in the block and graph storage unit 210. The simultaneous block 212 is a set of codes reliably executed at the identical time, created from a code after deleted. The control flow graph 214 is a graph representing a control relationship between the created simultaneous blocks, i.e., a control flow caused by branch or call. The WS graph 216 is a graph representing a synchronizing relationship established via a register between the simultaneous blocks 212. The LS graph 218 is a graph representing a LOAD or STORE relationship of the register.

The common execution frequency group creating unit 120 creates a common execution frequency group that is a set of codes as executed by identical count up to a certain time T (described later in detail) by using the simultaneous block 212, the control flow graph 214 representing a mutual relationship, the WS graph 216, and the LS graph 218, created in step S1. The common execution frequency group storage unit 220 stores the common execution frequency group (step S2).

The common execution frequency group can be expressed by a recurrence formula. Thus, the common execution frequency group analysis unit 130 creates the recurrence formula from the common execution frequency group obtained in step S2, and then, derives a general term of each register by solving the recurrence formula. The general term storage unit 230 stores the general term of each register (step S3). While the deriving of the general term from the recurrence formula can be achieved by referring to a database of a recurrence formula pattern, a generally known other method may be utilized. In the case where a formula of a new general term has been obtained in step S3, there is a possibility that the obtained formula can be utilized to derive another general term. Thus, turning to step S1, the process from the step S1 to step S3 are repeated (Yes in step S4).

In the case where a formula of a new general term cannot be obtained in step S3 (No in step S4), the relational analysis unit 140 derives an execution frequency up to time T of each common execution frequency group by utilizing the general terms of the simultaneous block 212, the control flow graph 214, the WS graph 216, the LS graph 218, and each register. The execution frequency storage unit 240 stores an execution frequency (step S5).

Next, the register value deriving unit 150 integrates the information stored in the general term storage unit 230 and the execution frequency storage unit 240, and then, derives a value of time T of each register that is a value of each register after a simulation time T has elapsed. The register value storage unit 250 stores the register value (step S6).

Lastly, the logic circuit model creating unit 160 creates a logic circuit model obtained as a high speed model at the time of a stationary state by using a value of each register in time T stored in the register value storage unit 250. The logic circuit model storage unit 410 stores the logic circuit model (step S7).

In the same manner as that described above, the logic circuit model at the time of a stationary state is created as a high speed model. Now, an operation of each unit will be specifically described here.

First, referring to an example of "Verilog-HDL" shown in FIG. 3, a description will be given with respect to an RTL logic circuit model that is an input of the logic circuit model conversion apparatus 100. The logic circuit model is often made of modules that correspond to some circuits. For example, in the example shown in FIG. 3, this circuit model is made of 5 modules M1 to M5.

The logic circuit model has some storage areas. For example, while "Verilog-HDL" has some data types such as a register type and a net type as a data type of storage area, all of such storage areas targeted for STORE, LOAD, and WAIT operations defined below are referred to as registers. For example, in module M1 shown in FIG. 3, "CLK", "RESET", "cnt", and "cnt_next" are registers. Write and readout operations relevant to these storage areas (registers) in the logic circuit model are hereinafter referred to as STORE and LOAD operations. For example, in "Verilog-HDL", a STORE operation such as "cnt<=0", is expressed. Expression of "cnt<=0" denotes that 0 is written into the register "cnt". In addition, expression of "cnt<=cnt_next" is expressed at the same time when a value loaded from the register "cnt_next" is stored in the register "cnt".

In the logic circuit model, in the present specification, a synchronizing operation synchronized with a change in value of a register such as "CLK" is referred to as WAIT. For example, in "Verilog-HDL", this synchronizing operation is achieved by an always statement. For example, the "always@ (cnt)" in module M2, represents that a node up to a corresponding end is executed from "always" in the case where the value of the register "cnt" is changed. Namely, in this example, when a different value is substituted into the register "cnt" in another module, module M2 is executed after module that carries out STORE operation to the register "cnt". An operation in such a case is referred to as "WAIT cnt".

WAIT operations in the logic circuit model has variations such as synchronization with any of a plurality of registers and synchronization with a positive or negative edge of a register. For example, the "posedge CLK OR negedge RESET" in module M1 is WAIT synchronized with any of posedge CLK and negedge RESET events, and module M1 is started up in accordance with either one of the events. The "posedge CLK" in module M3 is WAIT synchronized with a positive edge of the register CLK, and module M3 is started up only when a value of the register "CLK" has changed from 0 to 1. Similarly, "negedge RESET" is started up in the case where a value of a RESET register has changed from 1 to 0. The "always begin" in module M5 represents that the inside of the "always" statement is repeatedly executed.

An operation for advancing a simulation time in a logic circuit model is hereinafter referred to as DELAY. For example, in "Verilog-HDL", as in module M5, this DELAY operation is represented by #. The meaning of this #32 is that a simulation time is advanced by 32 (time units).

Next, an operation for representing branch is present in the logic circuit model. In the example shown in FIG. 3, there is an "if" statement. If a conditional formula is true, the interior of an "if" condition is executed. Otherwise, the interior of an "else" condition is executed.

Now, an operation of the circuit shown in the example of FIG. 3 will be briefly described here. First, module M5 (clock generator) supplies a clock "CLK", and module M1 and module M3 for this CLK to execute WAIT is started up. Module M3 and module M4 are modules for externally inputting a timer cycle "cikle". When IO==1, a value written into the register "IO_cikle" is employed as "cikle". Module M1 is a circuit for counting up a counter register "cnt" and clearing the register "cnt" to 0 in the case where RESET==0. Module M2 is a circuit for, when the value of the register "cnt" is obtained as a multiple of the value of the register "cikle", outputting 1 to a register "output". As a whole, this register is a circuit for outputting 1 to the register "output" every clock cycle inputted to "IO_cikle". Although expression in each module includes some failures because it is simplified, this expression is not shown because there is no relationship with the features of the present invention.

Although a description has been given here by way of example of "Verilog-HDL", it is essential that the logic circuit model can be composed of STORE, LOAD, WAIT, and DELAY operations and a BRANCH operation; other mathematical calculation, between numeric values such as Bit operation and the like. Therefore, an input HDL may be an HDL other than "Verilog" or may be another graph expression or the like that can reconfigure information equivalent to HDL.

In addition, the constraint description at the time of a stationary state stored in the constraint description storage unit 320 denotes a description that can restrict a state targeted for analysis by a register value, invariable value property and the like. For example, information indicating to which external register an external write operation is not carried out or information indicating what value is set at the time point at which no write occurs is described here. The logic circuit model conversion apparatus 100 operates even if this constraint description storage unit 320 does not exist, whereas there is a higher possibility that high speed HDL description can be outputted as the state restriction by this constraint description storage unit 320 is large in amount.

The example shown in FIG. 4 indicates that a constant value of a register RESET is 1, and a constant value of a register IO is 0, and a value of a register "IO_cikle" is invariable. Here, "constant" means known and unchanged and "invariable" means unknown but unchanged.

In an example of this timer, the value of the register "IO_cikle" is a timer cycle, and can be set by a user. However, this value becomes invariable after no input has occurred.

Now, a function and an operation of each unit will be specifically described here. First, with reference to FIG. 5, an operation of a model analysis unit 110 will be described here.

First, an unnecessary code is deleted (step S11).

An example of such an unnecessary code includes a group of "x<=x_next" and "x_next<=x", for example. In the case where no STORE operation to the register "x" or "x_next" exists, the mutually identical values are merely substituted, thus these two substituting formula can be eliminated.

Alternatively, in the case where there is no substituting operation to the register "x" despite the presence of "WAIT x", no other code succeeding "WAIT x" is executed, the code succeeding "WAIT x" can be eliminated.

When the value of a register can be determined at the time of a stationary state, the relevant register can be replaced to the value. Moreover, when a value of a register R is constant or invariable, if a WAIT operation of the register R exists, the code succeeding "WAIT x" can be eliminated.

A code newly made unnecessary is also deleted.

In FIG. 6, RESET=1 (constant) can be identified by the constraint description at the stationary state shown in FIG. 4, thus evaluating an "if" statement of module M1 and deleting an "if" condition. Similarly, "IO=0 (constant)" can be identified, thus evaluating an "if" statement of module M3 and deleting an "if" condition. The value of the register "RESET" is constant, and thus, "WAIT" is not started up due to a change in value of the register RESET. Thus, the register "RESET" is deleted from a WAIT statement of module M1.

Next, a simultaneous block is created (step S12). The simultaneous block is a set of codes surely executed at a same simulation time. In the logic circuit model, DELAY is an operation for advancing a simulation time, and the simulation time is different depending on a time preceding or succeeding the execution of the operation. In addition, a WAIT operation is started up by a STORE operation (for a register targeted for WAIT) placed in another location, and thus, there is a possibility that the simulation time is different depending on a time preceding or succeeding the execution of the operation. Therefore, the simultaneous block is created by segmenting codes every time a WAIT operation and a DELAY operation appear with respect to a source logic circuit model.

The simultaneous block creating process includes some exceptional process. For example, if an "if" statement or "posedge (negedge) WAIT" and the like is included, the simultaneous block is duplicated. However, an "if" statement indicating that all the contents of BRANCH is targeted for a STORE operation relevant to the same register is an exception, and then, no duplication is carried out.

A logic circuit model is segmented with respect to a source logic circuit model every time a WAIT operation and a DELAY operation appear, thereby creating a candidate for a simultaneous block (step S121). In the case where BRANCH caused by an "if" statement or the like is included in a simultaneous block candidate (Yes in step S122), the simultaneous block candidates are duplicated by the number of branches, and a plurality of simultaneous blocks corresponding to each branches are created (step S123). However, in the case where the content of each BRANCH is an operation of substitution into the identical register, it is handled as an exception, and no duplication is carried out. In step S122, in the case where BRANCH caused by an "if" statement or the like does not occur, a current step goes to step S124.

Further, in the case where a "posedge WAIT" condition occurs in WAIT (Yes in step S124), two simultaneous blocks candidates are created. One of them is created by replacing "posedge WAIT" of an original simultaneous block candidate by "WAIT", and the other is created as the empty WAIT block (step S125), and a current step returns to step S122.

In step S124, in the case where a "posedge" condition does not occur in WAIT, i.e., in the case where there does not occur an operation equivalent to Branch in a simultaneous block candidate, the simultaneous block candidate is handled as a simultaneous block (step S126).

Then, the process above is repeated until the whole logic circuit model is classified into any simultaneous block (step S127).

In FIG. 8, module M4 is a simultaneous block b4. Next, with respect to module M2, an "if" statement is included in a WAIT block. However, the contents of the "if" branch and the "else" branch are a substituting statement relevant to the same register (output). Therefore, duplication is not carried out as an exception of "if" statement, and a simultaneous block b2 is obtained. Next, module M1 includes a "WAIT posedge CLK", and thus, is targeted for duplication. Then, a simultaneous block b1 obtained by replacing "WAIT posedge CLK" with "WAIT CLK" and a simultaneous block b1-0 obtained by replacing "WAIT posedge CLK" with "WAIT CLK", the content of which is empty, are reproduced. Similarly, module M3 creates a simultaneous block b3 and a simultaneous block b3-0. Lastly, module M5 includes a DELAY operation, and thus, creates a simultaneous block b5-1 and a simultaneous block b5-2, respectively, while 2 DELAY operations are defined as a boundary.

As long as a hardware process is executable, even in the case where a more complicated logic circuit model has been inputted, a simultaneous block is obtained as a description with a finite length starting from WAIT or DELAY in accordance with the above procedures.

In addition, if a duplication of a simultaneous block including all the BRANCH operation and "posedge WAIT" is carried out, BRANCH operation and "posedge WAIT" are eliminated in the simultaneous block.

Next, after a process of a simultaneous block above, a control flow graph representing a control flow in which a simultaneous block is defined as a node is created with respect to a simultaneous block in which there is a possibility that another simultaneous block (not synchronous block) is made (step S13). The control flow graph denotes a directed graph while a simultaneous block is defined as a node. The edge denotes a state transition possibility other than synchronization from a simultaneous block to another simultaneous block.

Figure 9C:
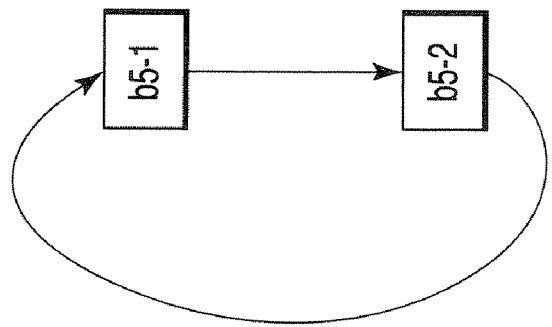
FIGS. 9A to 9C are views showing an example of creating a control flow graph in the case where there have been provided the logic circuit model shown in FIG. 3 and the constraint description at the time of a stationary state shown in FIG. 4.
Figure 9B:
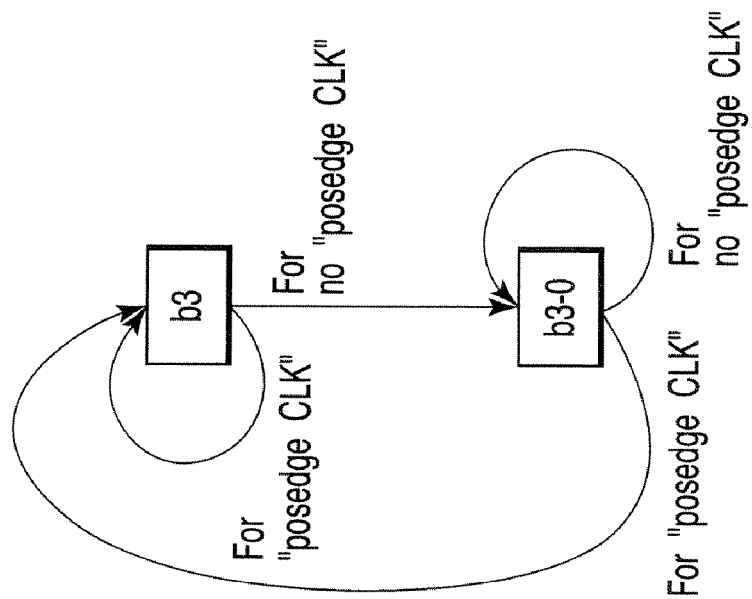
Figure 9A:
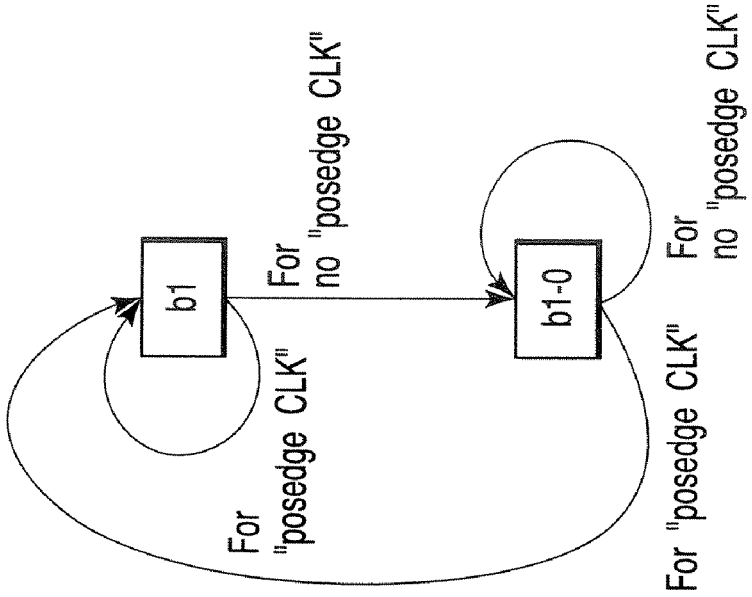

FIG. 9A is a view showing a state transition of a simultaneous block b1 and a simultaneous block b1-0. In FIG. 9A, the following two events are expressed. That is, after termination of the simultaneous block b1, in the case where "posedge CLK" occurs, a current block moves to the simultaneous block b1. Otherwise, the current block moves to the simultaneous block b1-0. In addition, after termination of the simultaneous block b1-0, in the case where "posedge CLK" occurs, a current block moves to the simultaneous block b1. Otherwise, the current block moves to the simultaneous block b1-0. As in FIG. 9A, FIG. 9B expresses a state transition relationship between a simultaneous block b3 and a simultaneous block b3-0. FIG. 9C expresses that the states of a simultaneous block b5-1 and a simultaneous block b5-2 appear alternately.

Next, a "WaitStore" graph (WS graph) is created (step S14). In the WS graph, while a simultaneous block and a register are defined as nodes, if a STORE operation to a register X occurs in a simultaneous block A, A=>X edge is added. If a WAIT operation of a register Y occurs, Y=>A edge is added and is created. The WS graph is a directed graph in which a simultaneous block and a register are defined as nodes. The edge from the simultaneous block X to a register R represents that the STORE operation to the register R occurs in the simultaneous block X. The edge from the register R to the simultaneous block represents that a WAIT operation of the register R occurs in the simultaneous block X. The WS graph represents a synchronizing control relationship of each module. The WS graph can be created by checking a register targeted for a WAIT operation and a STORE operation in each simultaneous block.

Figure 10:
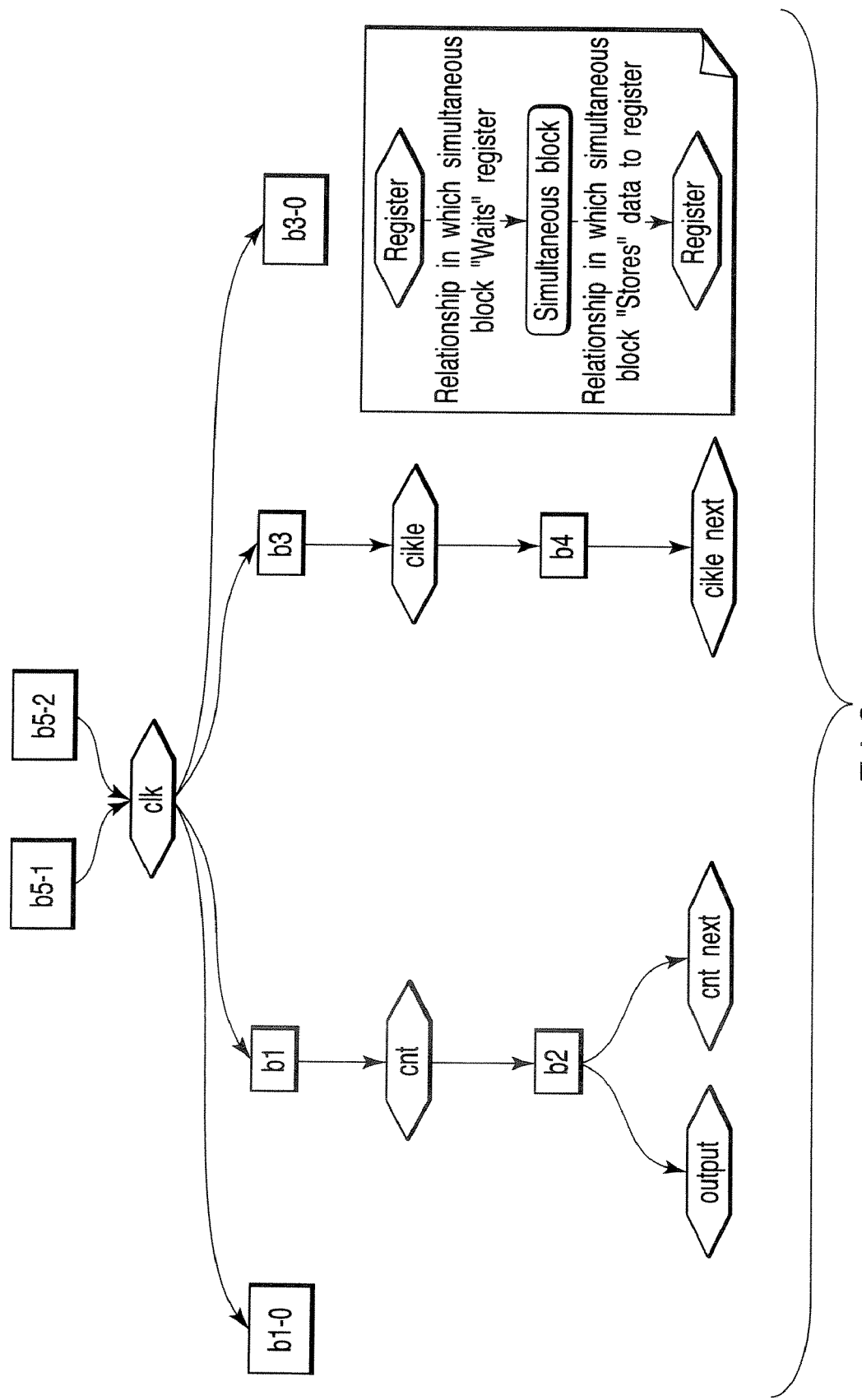
FIG. 10 is a view showing an example of creating a WS graph.

In the simultaneous block shown in FIG. 8, a description will be given with respect to a simultaneous block b1. In order to carry out a WAIT operation of a register "CLK", an edge is added between the register "CLK" and the block b1. The simultaneous block b1 includes the STORE operation to the register "cnt", and thus, an edge is added between the block b1 and the register "cnt". A relationship between such WAIT and STORE operations is shown in FIG. 10.

Next, a "LoadStore" graph (LS graph) is created (step S15). In the LS graph, while a simultaneous block and a register are defined as nodes, as long as the STORE operation to the register X occurs in the simultaneous block A, an A=>X edge is added. If LOAD from a register Y occurs, Y=>A edge is added, and is created. The LS graph denotes a directed graph in while a simultaneous block and a register are nodes. An edge from the simultaneous block A to the register X represents that a STORE operation to the register X occurs in the simultaneous block A. An edge from the register Y to the simultaneous block A represents that LOAD from the register Y occurs in the simultaneous block A.

The LS graph can be created by checking a register targeted for a LOAD operation and a STORE operation in a simultaneous block. A LOAD operation from a register determined to be unchanged or constant is no use, the LOAD edge corresponding to that register can be eliminated from LS graph.

Figure 11:
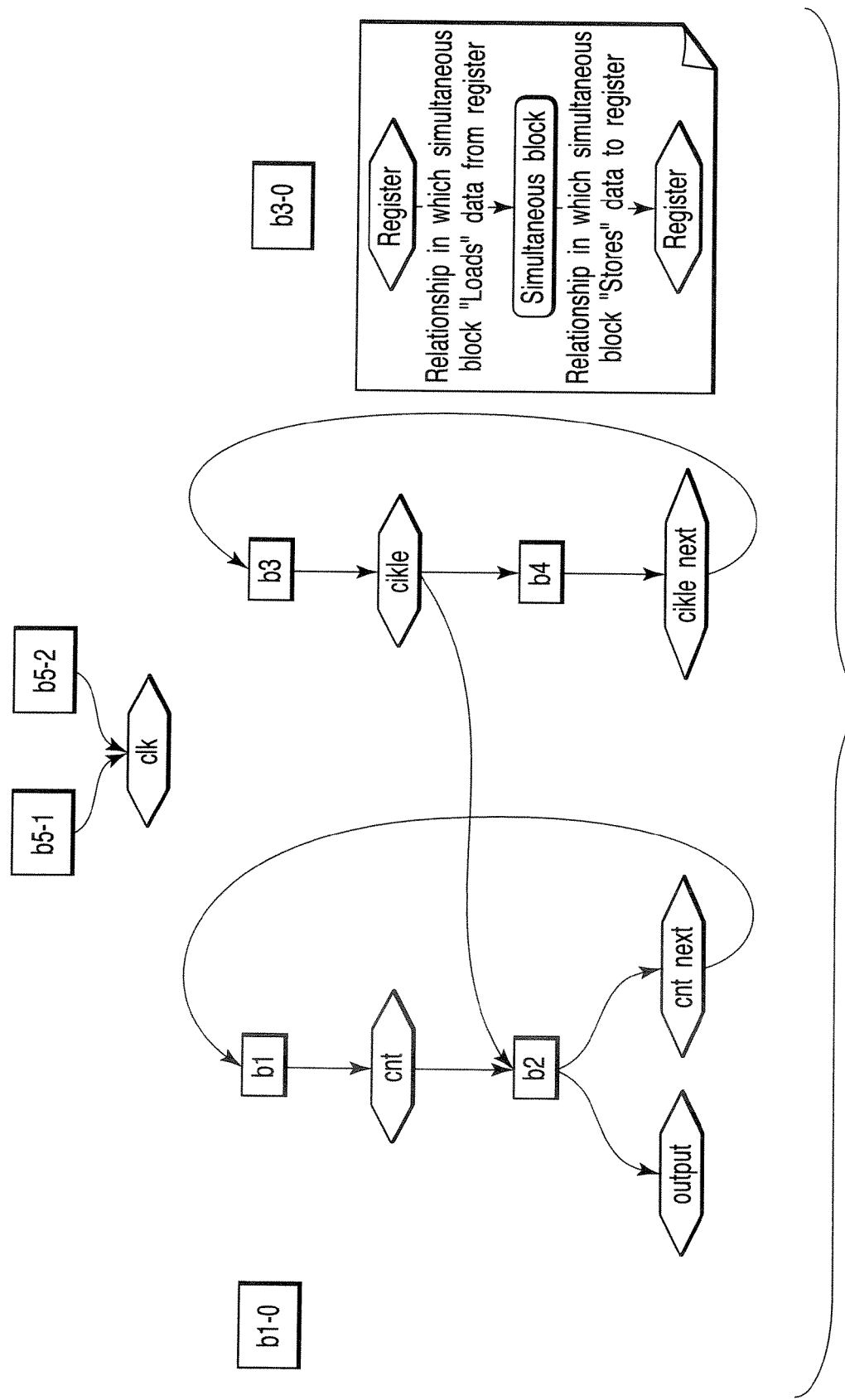
FIG. 11 is a view showing an example of creating an LS graph.

In the simultaneous block shown in FIG. 8, a description will be given with respect to a simultaneous block b1. In the simultaneous block b1, LOAD of a value of a register "cnt_next" occurs, an edge is added between the register "cnt_next" and the block b1. A STORE operation to the register "cnt" occurs in the simultaneous block b1, and thus, an edge is added between the block b1 and the register "cnt". FIG. 11 shows a relationship between such LOAD and STORE operations.

Figure 12:
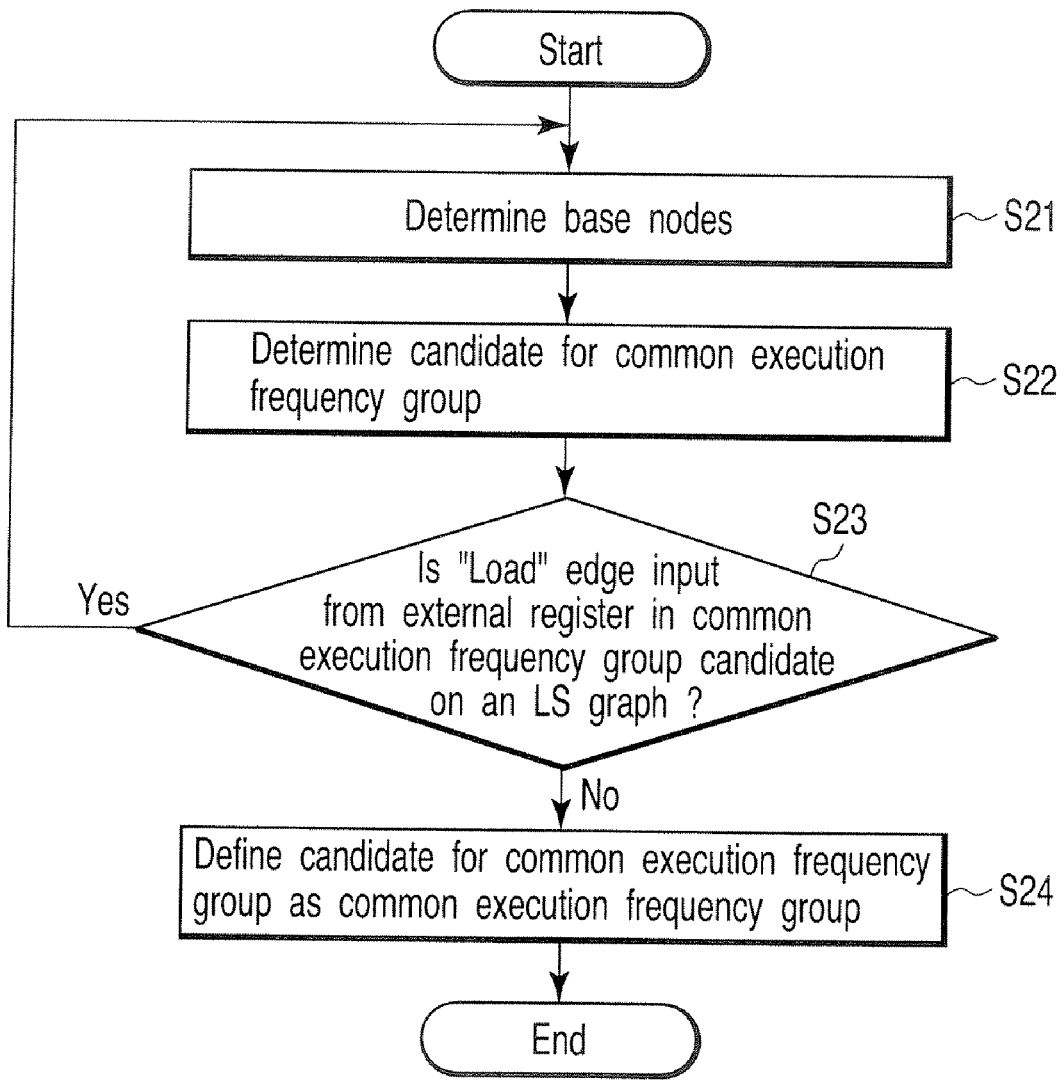
FIG. 12 is a flow chart showing a specific operation of a common execution frequency group creating unit 120.

Referring to FIG. 12, a description will be given with respect to an operation of the common execution frequency group creating unit 120.

From among nodes of a control flow graph (simultaneous block), the common execution frequency group creating unit 120 determines base nodes while unset nodes are defined as the base nodes (step S21). In addition, a WS graph and an LS graph are traced, respectively, from the base nodes, a common register set of a reachable nodes of WS graph and LS graph respectively are defined as candidates for the common execution frequency group (step S22). In this manner, the candidates for the common execute count group are determined.

If obtained candidates for common execution frequency group include an external input from a LOAD edge of the common execution frequency group (Yes in step S23), a current step reverts to step S21. In step S23, if no input from the LOAD edge occurs with the candidates for the common execution frequency group, candidates for the common execution frequency group are determined for the common execution frequency group (step S24), and then, a process terminates.

Figure 13:
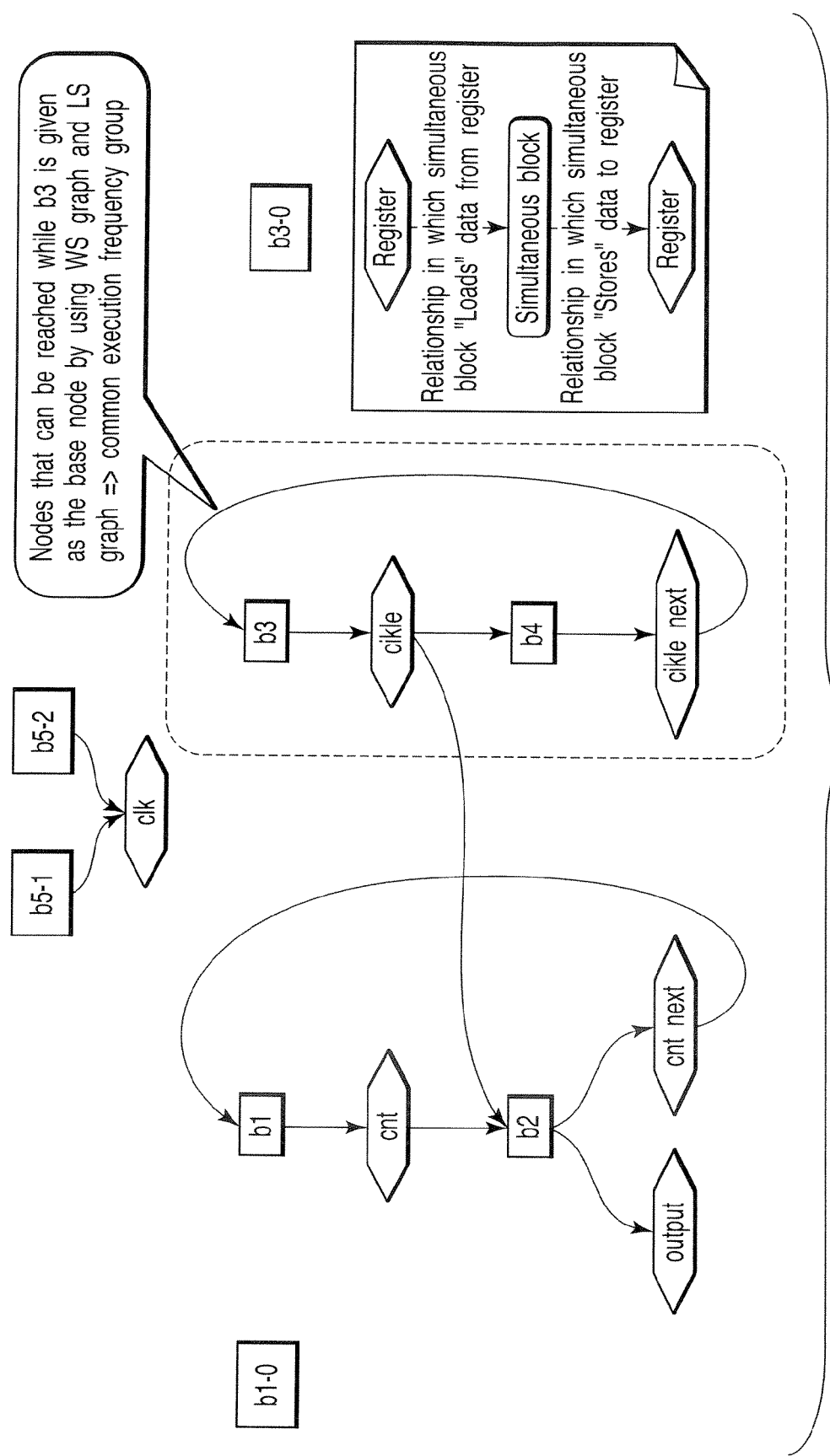
FIG. 13 is a view showing an example of creating a common execution frequency group in the case where there have been provided: the logic circuit model shown in FIG. 3; the constraint description at the time of a stationary state shown in FIG. 4; the simultaneous block shown in FIG. 8; the control flow graph shown in FIGS. 9A to 9C; the WS graph shown in FIG. 10; and the LS graph shown in FIG. 11.

In FIG. 13, a common execution frequency group is created, the group being made of a simultaneous block b3 and a simultaneous block b4, base nodes being the simultaneous block b3. This common execution frequency group is executed sequentially in order of the simultaneous block b3 and the simultaneous block b4. In this case, the startup count of the simultaneous block b3 coincides with that of the simultaneous block b4.

Here, the branch operation in step S23 is carried out in order to limit a common execution frequency group in which no external LOAD occurs. In the case where this condition is met, the thus obtained common execution frequency group has a property that the execution frequencies of all the internal simultaneous blocks coincide with each other.

This property does not depend on whether or not there exists a synchronizing operation (WAIT operation) started up by external STORE operation of the common execution frequency group. This is because, an operation of a simultaneous block caused by an external synchronizing operation is identical to an operation made at the time of internal operation of the common execution frequency group. In this manner, it is one of the advantageous effects of the present invention that a common execution frequency group in which this execution frequency can be regarded to be equal to another can be found out.

With reference to FIG. 14, an operation of a common execution frequency group analysis unit 130 will be described here.

First, a WS graph is traced from the base node of the common execution frequency group, thereby making a judgment before and after the register serving as each of the LOAD and STORE destinations (step S31). That is, a registered targeted for STORE is always obtained as a value of a next time. In the case where LOAD is carried out, a value of a current time is obtained if a value subjected to LOAD is obtained as a value before STORE operation If the above value is obtained as a value after STORE operation, a value of a next time is obtained as a value of a next time.

Here, in the common execution frequency group, after a simultaneous block serving as a base point of the common execution frequency group has been executed once, in the case where a change (STORE) operation of a value of a register in the common execution frequency group is made once until a next block is executed, a register serving as a LOAD destination is either of pre-change or post-change. In many executable cases, a judgment of pre-change or post-change can be made by analysis of a WS graph and an LS graph. If a simultaneous block of executing a STORE operation to the register loaded is "under" a simultaneous block of executing LOAD operation on a WS graph, the value loaded to the register is a pre-changed value. On the contrary, if a simultaneous block of executing a STORE operation to the register loaded is "over" a simultaneous block of executing LOAD operation on a WS graph, the value loaded to the register is a post-changed value.

The term "A over B" used here denotes that we can trace from node A to node B by the arrow, and the term "A under B" denotes that we can trace from node B to node A by the arrow.

For example, in the case where there occurs LOAD of a register "cikle_next" in a simultaneous block b3, a simultaneous block b4 of carrying out a STORE operation to the register "cikle_next" is on a WS graph and below the simultaneous block b3, and thus, it is found that a value before changed is obtained. In the case where there occurs LOAD of the register "cikle" in the simultaneous block b4, the simultaneous block b3 of carrying out a STORE operation to the register "cikle" is on a WS graph and above the simultaneous block b4, and thus, it is found that a value after changed is obtained.

With respect to a description such that two or more STORE counts exist or a description such that the top and bottom of a simultaneous block to which LOAD and STORE belong cannot be judged, there is a high possibility that an improper code is generated from a design point of view. In the case where such a judgment cannot be made, nothing is carried out in step S32, and the current process moves to step S33.

Next, a recurrence formula of a register is created (step S32). Here, based on information of judgment as to whether a register before or after changed is obtained in step S31, in response to each substituting calculation in a common execution frequency group, a recurrence formula is obtained by replacing a value before substituting a register X (i.e., value of current time) with X [k] and a value after substituting X (i.e., value of next time) with X [k+1] with respect to LOAD operation, and a value of a substituting destination with X [k+1] with respect to STORE operation. Here, BRANCH caused by an "if" statement remains unchanged. FIG. 15B is a view showing an example in which a recurrence formula has been created with respect to simultaneous blocks b3 and b4 (FIG. 15A) judged to be a common execution frequency group in step S2.

Next, production of a general term of a register is carried out (step S33). When the recurrence formula obtained in step S32 is regarded as a recurrence formula of a numeric sequence, the general term is obtained in the case where it can be analytically solved. This conversion rule may utilize a conversion table created in advance or may be determined by a user. In addition, any other existing method may be used. In the case where no general term can be created, "n" executing modules (a code for outputting the value of each register after executing a recurrence formula "n" times with respect to arbitrary "n") are created, and this term may be regarded as a general term.

For example, FIG. 15C shows an example in which a general term is created with respect to simultaneous blocks judged to be a common execution frequency group in step S2. In the following discussion, it is assumed that "cikle[0]= cikle_next[0], cnt[0]=cnt_next[0], cnt[0]=1" for the sake of simplification. In this case, in the case where recurrence formulas "cikle [k+1]=cikle_next [k]" and "cikle_next [k+1]= cikle [K+1]" shown in FIG. 15B are obtained, if these recurrence formulas are established when k≧0, it is well known that "cikle [k]=cikle [0]" or the like is obtained as a general term in a general solution of a numeric sequence. While this general term can be obtained by creating in advance a table of a group of a pattern of a corresponding recurrence formula and a pattern of a general term, the existing other method can also be used without being limited thereto in particular.

In response to a recurrence formula in which a general term of a register cannot be created, an n-time executing machine capable of creating the value of each register relevant to an arbitrary execution frequency "n" is created. This n-time executing machine is also regarded as a general term of a register in the following description. The production of the n-time executing machine can be achieved by a variety of methods without being limited thereto in particular.

The above described steps S2 and S3 are repeatedly executed in the case where a new general term has been generated, as shown in FIG. 2. This is because a new common execution frequency group may be reproduced in accordance with this new general term.

Figure 16:
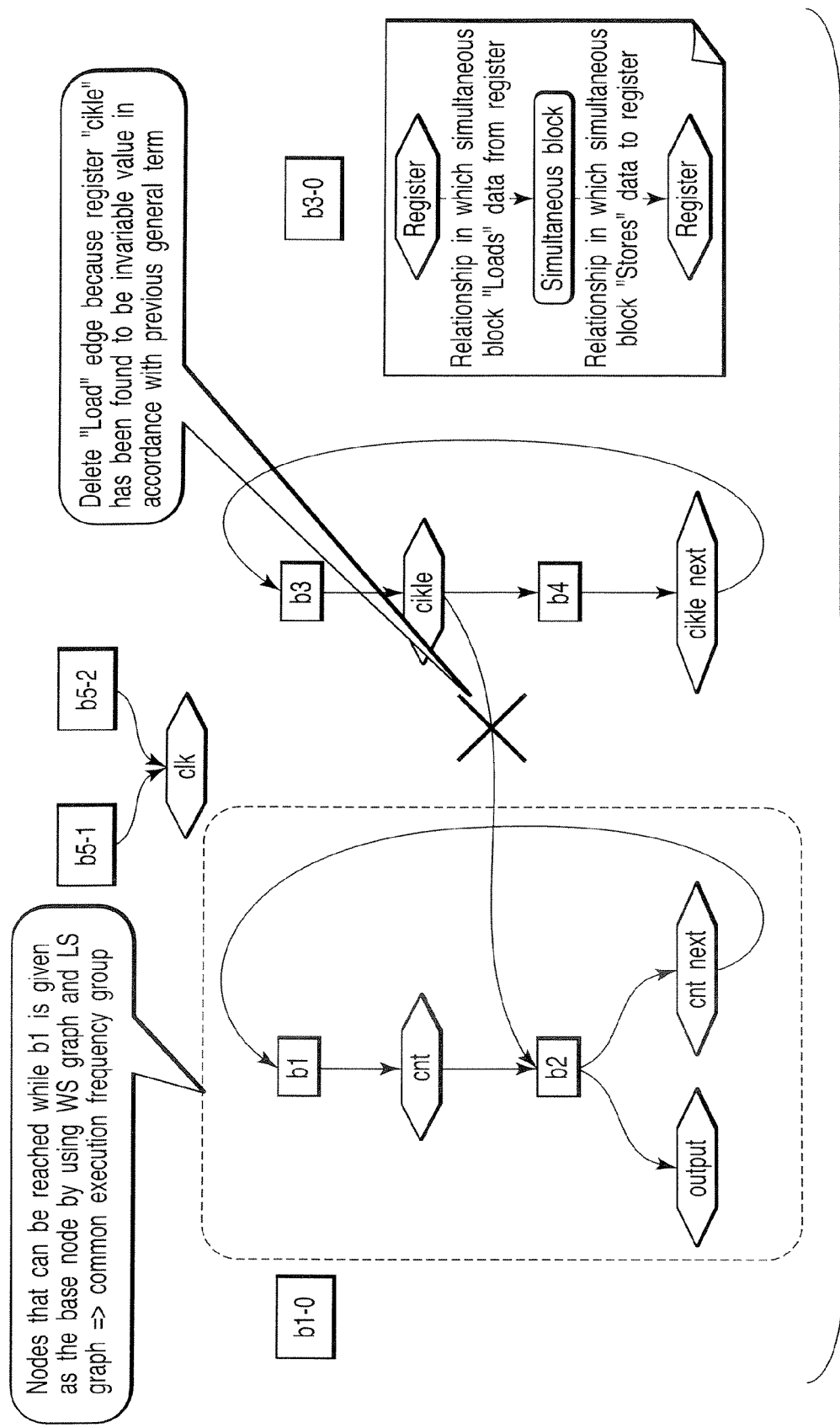
FIG. 16 is a view showing an example in which, in the case where there have been provided the logic circuit model shown in FIG. 3 and the constraint description at the time of a stationary state shown in FIG. 4, the general terms shown in FIGS. 15A to 15C is obtained, thereby making it possible to create a new common execution frequency group.

As shown in the LS graph of FIG. 16, it has been determined that the value of a register "cikle" is an invariable value from the general terms shown in FIGS. 15A to 15C. Thus, an edge from "cikle" to a simultaneous block b2 can be deleted. Due to an advantageous effect of a change in this LS graph, an external LOAD edge input is eliminated, a common execution frequency group candidate made of the simultaneous blocks b1 an b2 obtained in step S22 is obtained as a common execution frequency group.

Figures 17A, 17B, 17C:
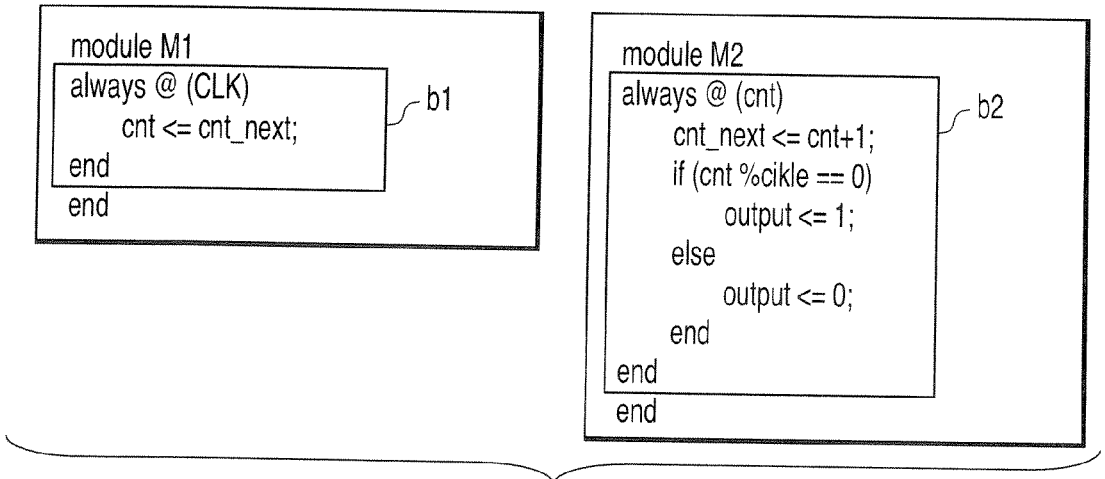
FIGS. 17A to 17C each show an example of applying step S3 relevant to the common execution frequency group candidates made of simultaneous blocks b1 and b2 shown in FIG. 16.

In FIGS. 17A to 17C, the recurrence formula and general terms are an example including conditional branch.

Among them, for example, with respect to the recurrence formulas "cnt [k+1]=cnt_next [k]" and "cnt_next [k+1]=cnt [k]+1", the general terms "cnt [t]=cnt [0]+t, cnt_next [t]=cnt [0]+t+1" can be obtained in accordance with a well known solution.

Figure 18:
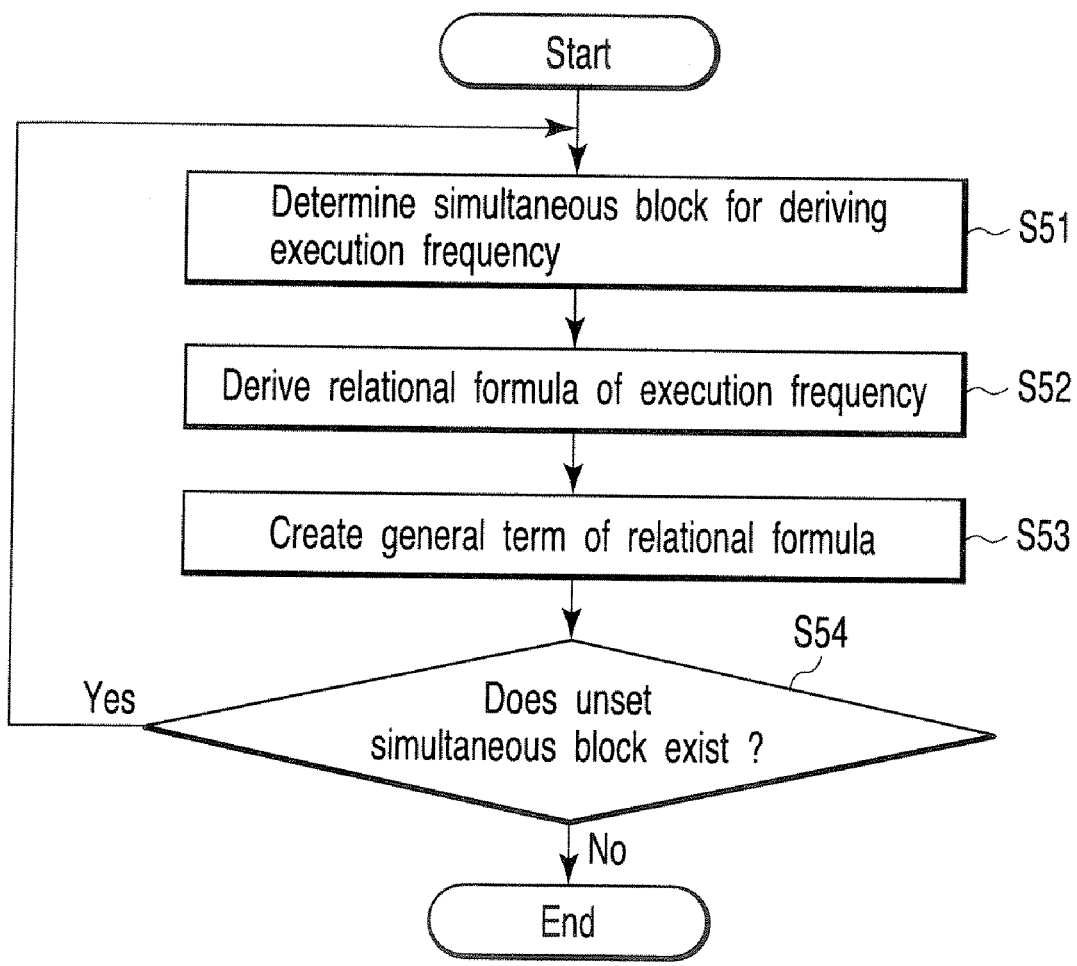
FIG. 18 is a flow chart showing a specific operation of a relational analysis unit 140.

Now, an operation of a relational analysis unit 140 will be described with reference to FIG. 18.

A simultaneous block for deriving an execution frequency is determined (step S51). Specifically, an unset simultaneous block is sampled from among a simultaneous block serving as a base point of a common execution frequency group or a simultaneous block that is not included in the common execution frequency group. Next, a relational formula relevant to an execution frequency of the unset simultaneous block is derived by means of analysis of a control flow graph (step S52). Then, a general term is created with respect to a simulation time in a relational formula of the execution frequency of the unset simultaneous block (step S53).

The process from step S51 to step S53 are repeated until the unset simultaneous block is eliminated (step S54).

Figure 19:
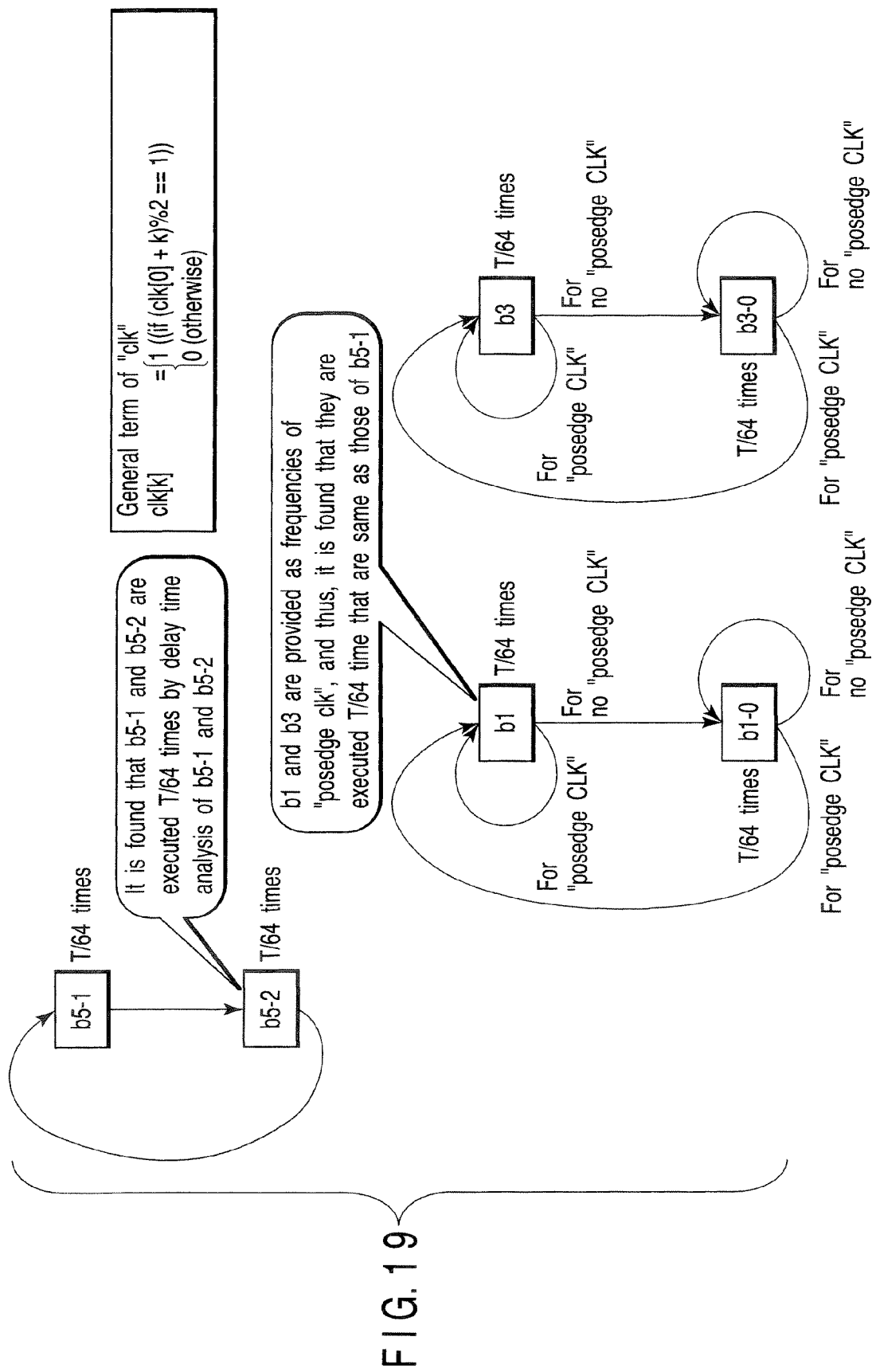
FIG. 19 is a view showing a deriving result of an execution frequency up to time T of a simultaneous block by the relational analysis unit 140 in the case where there have been provided: the logic circuit model shown in FIG. 3; the constraint description at the time of a stationary state shown in FIG. 4; the simultaneous block shown in FIG. 8; the control flow graph shown in FIGS. 9A to 9C; the WS graph shown in FIG. 10; and the LS graph shown in FIG. 11.

In FIG. 19, 32 (time unit) DELAY occur inside of each one of the simultaneous blocks b5-1 and b5-2 executed alternately, and thus, it is found that b5-1 and b5-2 are executed by T/64 times (strictly, T/64+1 times) after time T has elapsed. In addition, an operation of substituting 1 for "clk" of b5-1 and an operation of substituting 0 for "clk" of b5-2 are alternately carried out, and thus, a change of 0=>1 of "clk" occurs T/64 times until time T is reached. From this fact, it is found that "posedge WAIT clk" started up due to a change of 0=>1 occurs by T/64 times until time T is reached. Therefore, it is found the execution frequency of each one of the simultaneous blocks b1 and b3 (and b1-0 and b3-0) is T/64 times.

Figure 20:
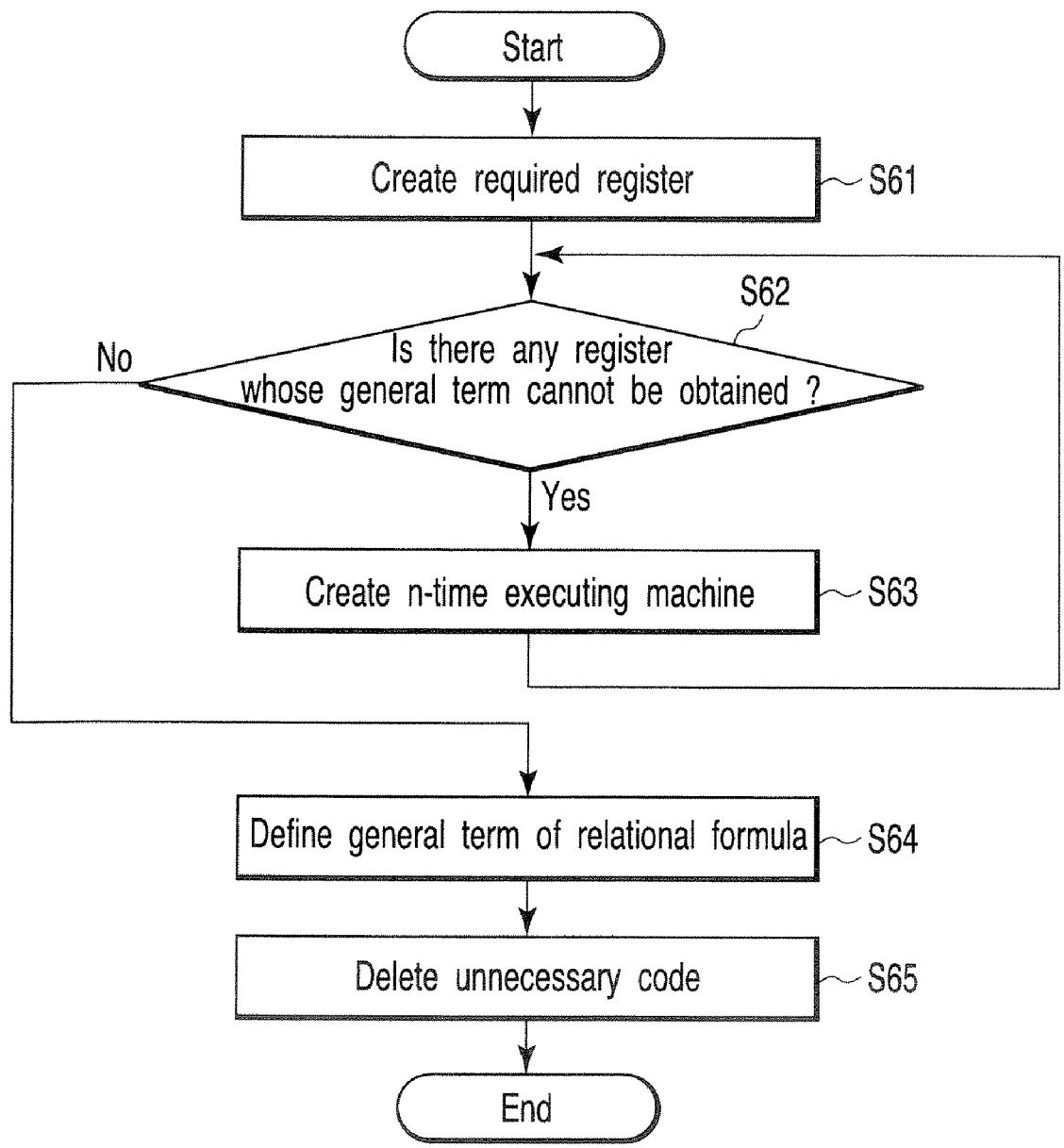
FIG. 20 is a flow chart showing a specific operation of a register value deriving unit 150.

Now, an operation of a register value deriving unit 150 will be described with reference to FIG. 20.

First, production of a necessary register is carried out (step S61). Specifically, a register for inputting a simulation time and a register for storing the initial value of each register are created. In addition, a register for storing the value of each register after elapse of a simulation time T that is an output result is created. In addition, a register for storing an execution frequency is provided with respect to each of the common execution frequency groups.

Next, in the case where there exists a register whose general term cannot be obtained (Yes in step S62), a recurrence formula of a register X is executed by a required number (for example, n times), a module (n-time executing machine) for outputting a result to the register X is created, and the created module is regarded as a general term (step S63).

In the case where there does not exist a register whose general term cannot be obtained, a general term of a register for storing the execution frequency of each common execution frequency group and a general term of each register created in step S61 are combined with each other, and a relational formula for obtaining a value of time T of each register (i.e., at the time when a simulation time T has elapsed) is created (step S64). Then, an unnecessary code is deleted by deletion of wasteful operation (step S65).

Figures 21A, 21B:
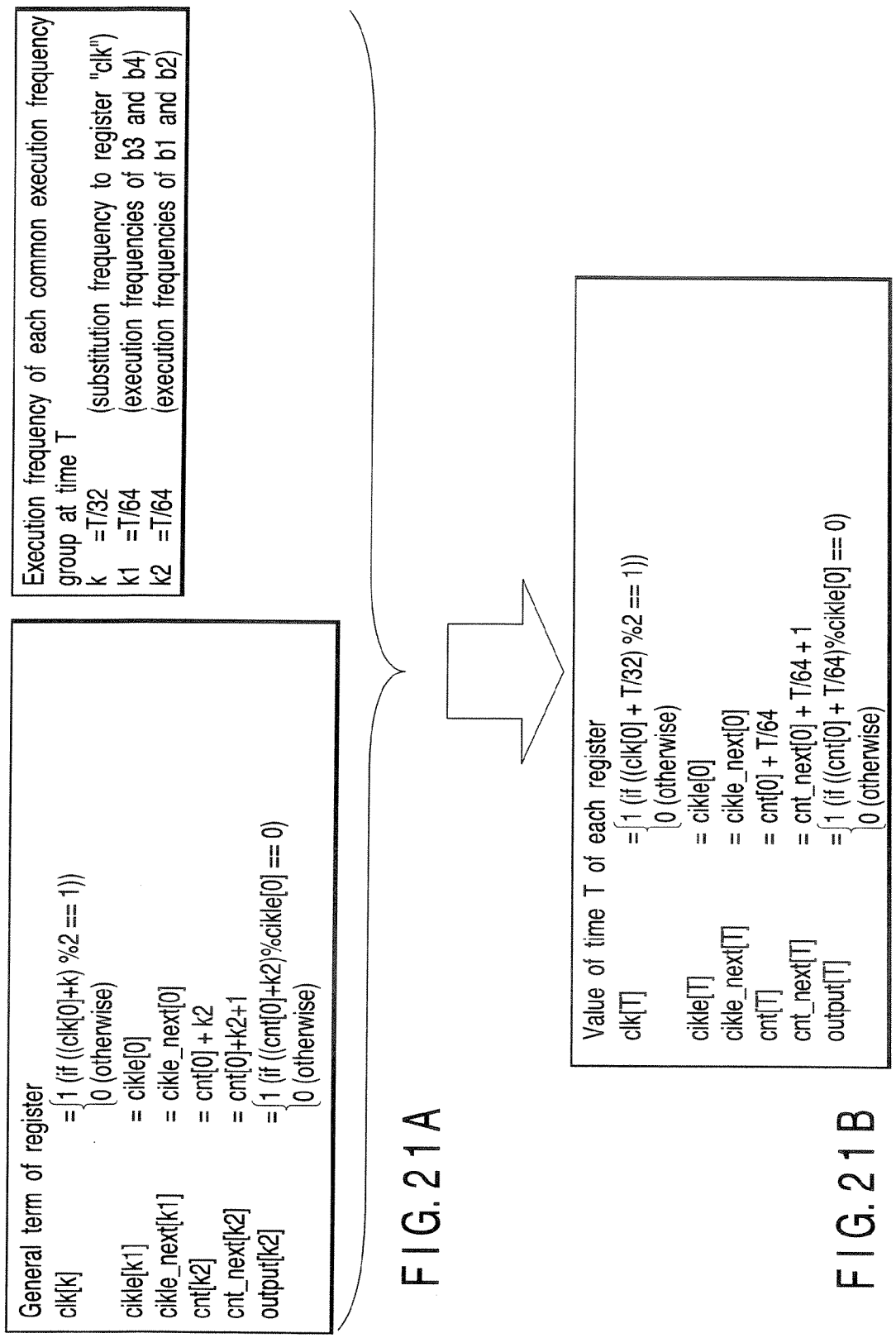
FIGS. 21A and 21B are views each showing an example of a value in simulation time T of each register.

FIG. 21A shows a general term of each register obtained in the case where there have been provided: the logic circuit model shown in FIG. 3; the constraint description at the time of a stationary state shown in FIG. 4; the simultaneous block shown in FIG. 8; the control flow graph shown in FIGS. 9A to 9C; the WS graph shown in FIG. 10; and the LS graph shown in FIG. 11 (a result of step S61). The execution frequency of the general term of each register differs depending on a common execution frequency group to which such each register belongs to. Therefore, a subscript of the general term of each register is adjusted to that for adjusting the right side execution frequency.

For example, in the case of the register "cnt" exemplified above, although the general term "cant [k2]=cnt [0]+k2" is obtained, the execution frequency of the common execution frequency group to which the register "cnt" up to time T belongs is T/64. Therefore, the general term in simulation time T is found to be "cant [t]=cnt [0]+T/64".

Similarly, the general term (value) in simulation time T of each register is obtained as shown in FIG. 21B (a result of step S63).

An operation of a logic circuit model creating unit 160 will be described below. A process of the logic circuit model creating unit 160 cannot be generally described because it is different depending on an output mode. In FIG. 22, all of the register values in simulation time T are obtained merely by executing the created module only once.

The logic circuit model created in the present embodiment is a logic circuit model for making an operation of obtaining the value of each register after time T has elapsed from the initial value of each register relevant to a first time in a stationary state and an elapsed time T from the first time.

In FIG. 22, registers having stored the initial value of each register at the first time in the stationary state are CLK0, cikle0, cikle_next0, cnt0, cnt_next0, and output0, and a register for storing an elapsed time is register T. Based on the values of these registers, the value of each register after time T has elapsed is outputted to each of the corresponding registers "CLK", "cikle", "cikle_next", "cnt", "cnt_next", and "output".

In the above described embodiment, although a "Verilog-HDL" description is outputted the output of the present invention is not limited to HDL as long an expression capable of reconfiguring HDL of RTL. For example, graph expression or the like of abstracting HDL while maintaining information equivalent to HDL may be used as an output.

Now, a description will be given with respect to an advantageous effect of the achievement of a high speed operation in the case of the logic circuit model shown in FIG. 3 and in the case of the constraint description at the time of a stationary state shown in FIG. 4.

In order to obtain the value of each register after simulation time T has elapsed, there is a need for executing a circuit that includes 3 "if" statements and 6 "substitute" statements for every clock (a total of T/64 times) in the original logic circuit model (FIG. 3).

On the other hand, in the logic circuit model serving as an output shown in FIG. 22, the value of each register is obtained by executing the circuit that includes 2 "if" statements and 6 substitute statements only once. Thus, in this example, all codes behaving in a periodic manner can be stopped in stationary state. And it is possible to say that the longer simulation time is, the more efficient code is obtained.

As mentioned above, the high speed simulation of RTL accuracy can be achieved. Specifically, it become possible to make accurate "Logic circuit operation model" that achieves the accuracy of RTL to achieve the verification purpose and put the simulation execution time in permissible time even if it is a large-scale system.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A logic circuit model implemented by a computer as a logic circuit model conversion apparatus comprising:
a first analysis unit which analyzes the logic circuit model in which a logic circuit of a register transfer level has been coded and outputs simultaneous blocks executed at the same time and an analysis result;
a creating unit which creates a common execution frequency group that is a set of codes whose execution frequency becomes common, based on the simultaneous blocks and the analysis result;
a second analysis unit which analyzes the common execution frequency group and creates a formula of a general term of a numeric sequence, to derive a predetermined value of each register, wherein values of the register at a plurality of times are regarded as the numeric sequence;
a third analysis unit which analyzes a mutual relationship between the common execution frequency groups and derives an execution frequency of each common execution frequency group up to a predetermined time; and
a deriving unit which derives a value of each of the registers at the predetermined time from the formula of the general term and the execution frequency, wherein
the simultaneous blocks are created by sequentially segmenting all codes for every code equivalent to WAIT and DELAY.

2. The apparatus according to claim 1, wherein the first analysis unit analyzes a logic circuit model of a register transfer level and a constraint description at the time of a stationary state and outputs the simultaneous blocks and the analysis result.

3. The apparatus according to claim 2, wherein the first analysis unit deletes an unnecessary code described in the logic circuit model, based on the constraint description at the time of the stationary state.

4. The apparatus according to claim 1, wherein the analysis result includes a control flow graph, a WS (WaitStore) graph, and an LS (LoadStore) graph.

5. The apparatus according to claim 4, wherein the control flow graph is provided as a graph indicating sequences for process in a plurality of simultaneous blocks while the simultaneous block is defined as a node.

6. The apparatus according to claim 5, wherein the WS graph is provided as a graph representing a synchronous relationship via a register interposed between simultaneous blocks.

7. The apparatus according to claim 6, wherein the LS graph is provided as a graph representing a relationship between LOAD and STORE operations of a register.

8. The apparatus according to claim 1, wherein the second analysis unit creates a formula of a general term of each register by creating a recurrence formula from the common execution frequency group.

9. The apparatus according to claim 8, wherein the second analysis unit creates the recurrence formula by replacing a value of a current time with a value of a next time of one of the registers.

10. The apparatus according to claim 1, wherein, in the case where a new formula of a general term is created by means of the second analysis unit, model analysis by the first analysis unit, production of a common execution frequency group by the creating unit, and production of a formula of a general term by the second analysis unit are carried out.

11. The apparatus according to claim 1, further comprising:
a logic circuit model creating unit which inputs a value of the predetermined time of each register and outputs a description of a logic circuit operation at the time of a stationary state.

12. A logic circuit model converting method implemented by a computer as a logic circuit model conversion apparatus for outputting a description of a logic circuit operation at the time of a stationary state based on a model in which a logic circuit of a register transfer level has been coded and a constraint description at the time of a stationary state, the method comprising:
analyzing a model in which a logic circuit of a register transfer level has been coded, to output simultaneous blocks executed at the same time and an analysis result;
creating a common execution frequency group that is a set of codes whose execution frequency becomes common, based on the simultaneous blocks and the analysis result;
analyzing the common execution frequency group to create a formula of a general term of a numeric sequence, to derive a predetermined value of each register, wherein values of the register at a plurality of times are regarded as the numeric sequence;
analyzing a mutual relationship between the common execution frequency groups to derive an execution frequency of each common execution frequency group up to a predetermined time; and
deriving a value of each of the registers at the predetermined time from the formula of the general term and the execution frequency, wherein
the simultaneous blocks are created by sequentially segmenting all codes for every code equivalent to WAIT and DELAY.

13. A logic circuit model conversion program stored on a computer-readable storage medium which, when executed by a computer, causes the computer to output a description of a logic circuit operation at the time of a stationary state based on a model in which a logic circuit of a register transfer level has been coded and a constraint description at the time of a stationary state, the program comprising:

means for analyzing a model in which a logic circuit of a register transfer level has been coded, to output simultaneous blocks executed at the same time and an analysis result;

means for creating a common execution frequency group that is a set of codes whose execution frequency becomes common, based on the simultaneous blocks and the analysis result;

means for analyzing the common execution frequency group to create a formula of a general term of a numeric sequence, to derive a predetermined value of each register, wherein values of the register at a plurality of times are regarded as the numeric sequence;

means for analyzing a mutual relationship between the common execution frequency groups to derive an execution frequency of each common execution frequency group up to a predetermined time; and means for deriving a value of each of the registers at the predetermined time from the formula of the general term and the execution frequency, wherein the simultaneous blocks are created by sequentially segmenting all codes for every code equivalent to WAIT and DELAY.

* * * * *